(12) United States Patent
Rastogi et al.

(10) Patent No.: US 10,699,998 B2
(45) Date of Patent: Jun. 30, 2020

(54) SEMICONDUCTOR DEVICES WITH INSULATED SOURCE/DRAIN JUMPER STRUCTURES

(71) Applicant: Samsung Electronics Co., Ltd., Suwon-si, Gyeonggi-do (KR)

(72) Inventors: Sidharth Rastogi, Hwaseong-si (KR); Subhash Kuchanuri, Hwaseong-si (KR); Jae Seok Yang, Hwaseong-si (KR); Kwan Young Chun, Suwon-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/936,882

(22) Filed: Mar. 27, 2018

(65) Prior Publication Data

US 2019/0080998 A1   Mar. 14, 2019

(30) Foreign Application Priority Data

Sep. 11, 2017 (KR) .................. 10-2017-0116018

(51) Int. Cl.
*H01L 23/522* (2006.01)
*H01L 27/092* (2006.01)
(Continued)

(52) U.S. Cl.
CPC .. *H01L 23/5221* (2013.01); *H01L 21/823821* (2013.01); *H01L 21/823871* (2013.01);
(Continued)

(58) Field of Classification Search
None
See application file for complete search history.

(56) References Cited

U.S. PATENT DOCUMENTS 8,358,012 B2   1/2013   Haran et al.
8,847,295 B2 * 9/2014   Shieh .................. H01L 29/7855
                                                                257/287
(Continued)

FOREIGN PATENT DOCUMENTS

KR   20160003978   1/2016
KR   20160019276   2/2016

*Primary Examiner* — Andres Munoz
(74) *Attorney, Agent, or Firm* — Muir Patent Law, PLLC

(57) ABSTRACT

A semiconductor device includes an insulator on a substrate and having opposite first and second sides that each extend along a first direction, a first fin pattern extending from a third side of the insulator along the first direction, a second fin pattern extending from a fourth side of the insulator along the first direction, and a first gate structure extending from the first side of the insulator along a second direction transverse to the first direction. The device further includes a second gate structure extending from the second side of the insulator along the second direction, a third fin pattern overlapped by the first gate structure, spaced apart from the first side of the insulator, and extending along the first direction, and a fourth fin pattern which overlaps the second gate structure, is spaced apart from the second side, and extends in the direction in which the second side extends. An upper surface of the insulator is higher than an upper surface of the first fin pattern and an upper surface of the second fin pattern.

20 Claims, 28 Drawing Sheets

(51) Int. Cl.
    *H01L 21/8238*    (2006.01)
    *H01L 29/06*    (2006.01)
    *H01L 21/84*    (2006.01)
    *H01L 27/12*    (2006.01)

(52) U.S. Cl.
    CPC .. *H01L 21/823878* (2013.01); *H01L 27/0924* (2013.01); *H01L 29/0653* (2013.01); *H01L 21/845* (2013.01); *H01L 27/1211* (2013.01)

(56) References Cited

U.S. PATENT DOCUMENTS

| | | | |
|---|---|---|---|
| 8,878,309 B1 * | 11/2014 | Hong | H01L 27/0886 257/401 |
| 9,006,834 B2 | 4/2015 | Schultz | |
| 9,035,679 B2 | 5/2015 | Yuan et al. | |
| 9,318,476 B2 | 4/2016 | Chen et al. | |
| 9,412,616 B1 | 8/2016 | Xie et al. | |
| 9,508,727 B2 * | 11/2016 | Park | H01L 21/823828 |
| 9,515,172 B2 * | 12/2016 | Shin | H01L 29/66818 |
| 9,536,835 B2 | 1/2017 | Song et al. | |
| 9,627,542 B2 * | 4/2017 | Kwon | H01L 21/845 |
| 9,704,864 B2 * | 7/2017 | Park | H01L 27/0886 |
| 9,716,042 B1 * | 7/2017 | Basker | H01L 29/0657 |
| 9,721,950 B2 * | 8/2017 | You | H01L 27/0886 |
| 9,799,607 B2 | 10/2017 | Song et al. | |
| 9,899,267 B1 * | 2/2018 | Liou | H01L 21/823878 |
| 10,032,886 B2 * | 7/2018 | Chung | H01L 27/0886 |
| 10,141,312 B2 * | 11/2018 | Jeon | H01L 27/0924 |
| 10,256,155 B1 * | 4/2019 | Lin | H01L 23/528 |
| 10,269,958 B2 * | 4/2019 | Kwon | H01L 27/092 |
| 2007/0134884 A1 * | 6/2007 | Kim | H01L 21/823437 438/424 |
| 2013/0175584 A1 * | 7/2013 | Ho | H01L 29/66795 257/288 |
| 2014/0151810 A1 * | 6/2014 | Maeda | H01L 29/41791 257/365 |
| 2015/0054078 A1 * | 2/2015 | Xie | H01L 29/785 257/347 |
| 2015/0147860 A1 * | 5/2015 | Kim | H01L 29/66795 438/283 |
| 2016/0071848 A1 | 3/2016 | Sengupta et al. | |
| 2016/0247876 A1 * | 8/2016 | Chung | H01L 29/0649 |
| 2016/0284806 A1 * | 9/2016 | Park | H01L 29/41791 |
| 2016/0336183 A1 | 11/2016 | Yuan et al. | |
| 2017/0004998 A1 | 1/2017 | Pethe et al. | |
| 2017/0133380 A1 | 5/2017 | Kim et al. | |
| 2017/0194493 A1 * | 7/2017 | Kwon | H01L 27/092 |
| 2017/0271336 A1 | 9/2017 | Park et al. | |
| 2018/0138092 A1 * | 5/2018 | Lee | H01L 21/823462 |
| 2018/0219094 A1 * | 8/2018 | Kwon | H01L 27/092 |
| 2018/0240881 A1 * | 8/2018 | Jung | H01L 29/0653 |

* cited by examiner

SEMICONDUCTOR DEVICES WITH INSULATED SOURCE/DRAIN JUMPER STRUCTURES

CROSS-REFERENCE TO RELATED APPLICATION

This application claims the benefit of Korean Patent Application No. 10-2017-0116018, filed on Sep. 11, 2017, in the Korean Intellectual Property Office, the disclosure of which is incorporated herein in its entirety by reference.

BACKGROUND

1. Field

The present inventive concept relates to semiconductor devices and, more particularly, to connection structures in semiconductor devices.

2. Description of the Related Art

Semiconductor devices are becoming smaller in size and higher in performance. To become smaller, semiconductor devices are required to be more highly integrated. Thus, semiconductor devices are being scaled down.

As semiconductor devices are scaled down, the gap between a gate of a transistor and a contact formed on a source/drain of the transistor is being rapidly reduced.

SUMMARY

Aspects of the inventive concept can provide a semiconductor device having improved integration density and reliability by including an insulator that separates gate structures.

Aspects of the inventive concept can also provide a semiconductor device having improved integration density and reliability by including a source/drain contact formed on an insulator that separates gate structures.

However, aspects of the inventive concept are not restricted to the one set forth herein. The above and other aspects of the inventive concept will become more apparent to one of ordinary skill in the art to which the inventive concept pertains by referencing the detailed description of the inventive concept given below.

According to some embodiments of the inventive concept, a semiconductor device includes an insulator on a substrate and having opposite first and second sides that each extend along a first direction, a first fin pattern extending from a third side of the insulator along the first direction, a second fin pattern extending from a fourth side of the insulator along the first direction, and a first gate structure extending from the first side of the insulator along a second direction transverse to the first direction. The device further includes a second gate structure extending from the second side of the insulator along the second direction, a third fin pattern overlapped by the first gate structure, spaced apart from the first side of the insulator, and extending along the first direction, and a fourth fin pattern which overlaps the second gate structure, is spaced apart from the second side, and extends in the direction in which the second side extends. An upper surface of the insulator is higher than an upper surface of the first fin pattern and an upper surface of the second fin pattern.

Some embodiments provide a semiconductor device including a field insulating layer disposed on a substrate, spaced apart first and second fin patterns protruding from an upper surface of the field insulating layer, and an insulating pattern disposed between the first fin pattern and the second fin pattern and protruding from the upper surface of the field insulating layer. The device further includes a first gate structure disposed on the first fin pattern, a second gate structure disposed on the second fin pattern, and an insulator disposed on the field insulating layer, covering the insulating pattern and contacting the first gate structure and the second gate structure.

Further embodiments provide a semiconductor device including an insulator disposed on a substrate and including opposite first and second sides extending along a first direction, a first fin pattern extending from a third side of the insulator along a second direction transverse to the first direction, a second fin pattern extending from a fourth side of the insulator opposite the third side and in the second, and an insulating pattern underlying the insulator and between the first fin pattern and the second fin pattern. The device further includes a first gate structure extending from the first side of the insulator along the first direction and a second gate structure extending from the second side of the insulator along the first direction and insulated from the first gate structure by the insulator. An upper surface of the insulator is higher than an upper surface of the first fin pattern and an upper surface of the second fin pattern.

Still further embodiments provide a semiconductor device including a first fin pattern disposed on a substrate and extending along a first direction, a first gate structure extending along a second direction transverse to the first direction and overlapping the first fin pattern, a first source/drain region disposed on a first side of the first gate structure and overlapping the first fin pattern and a second source/drain region disposed on a second side of the first gate structure, overlapping the first fin pattern, and connected to the first source/drain region.

BRIEF DESCRIPTION OF THE DRAWINGS

These and/or other aspects will become apparent and more readily appreciated from the following description of some embodiments, taken in conjunction with the accompanying drawings in which.

DETAILED DESCRIPTION

Figure 1:
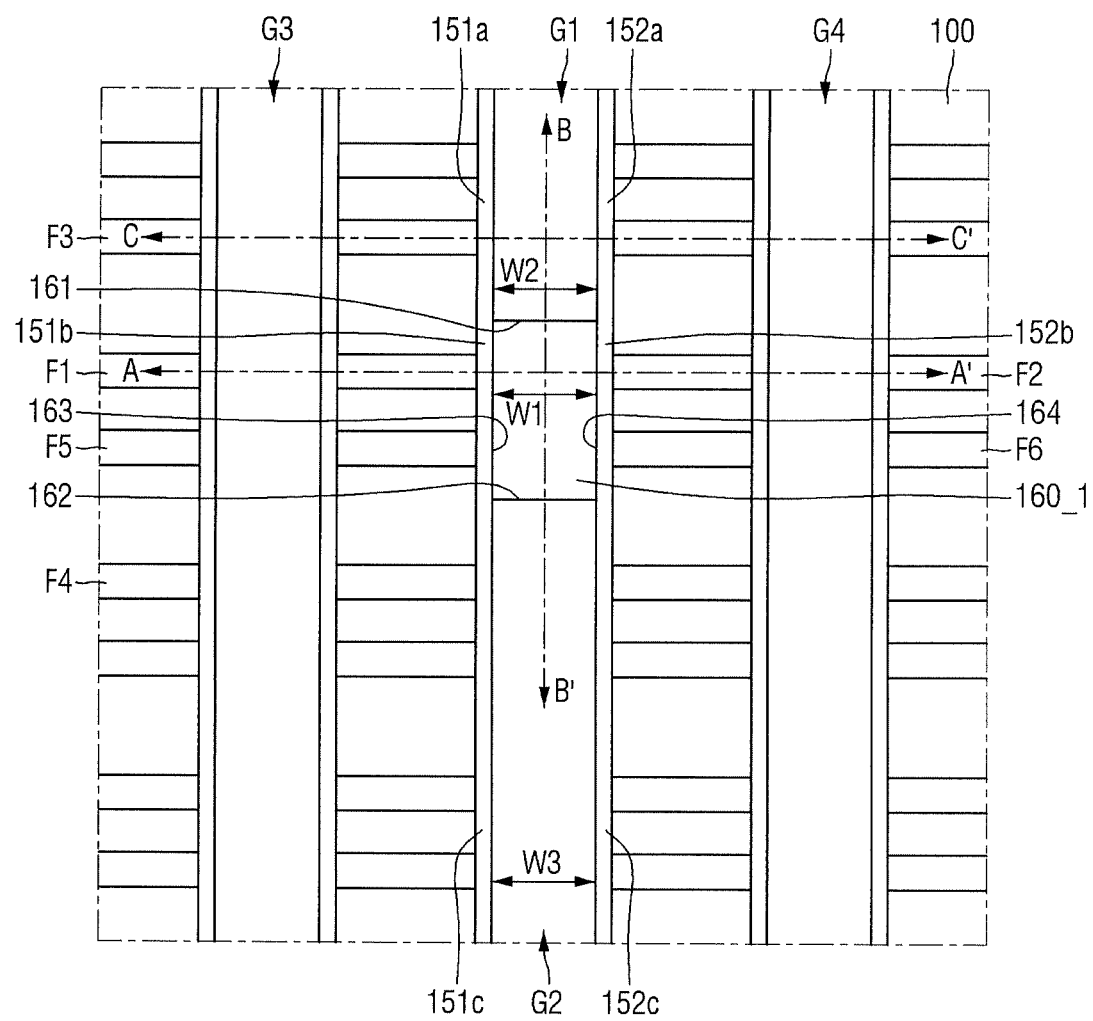
FIG. 1 is a layout view of a semiconductor device according to some embodiments.

Although fin field-effect transistors (FinFETs) including channel regions shaped like fin patterns are illustrated in the drawings related to semiconductor devices according to some embodiments, the inventive concept is not limited to this case. The semiconductor devices according to some embodiments can include tunneling field-effect transistors (FET), transistors including nanowires, transistor including nanosheets, or three-dimensional (3D) transistors. In addition, the semiconductor devices according to some embodiments can include bipolar junction transistors or lateral double-diffused metal oxide semiconductor (LDMOS) transistors.

Further, although semiconductor devices according to some embodiments are described as multi-channel transistors using fin patterns, they may also be planar transistors.

Figure 2:
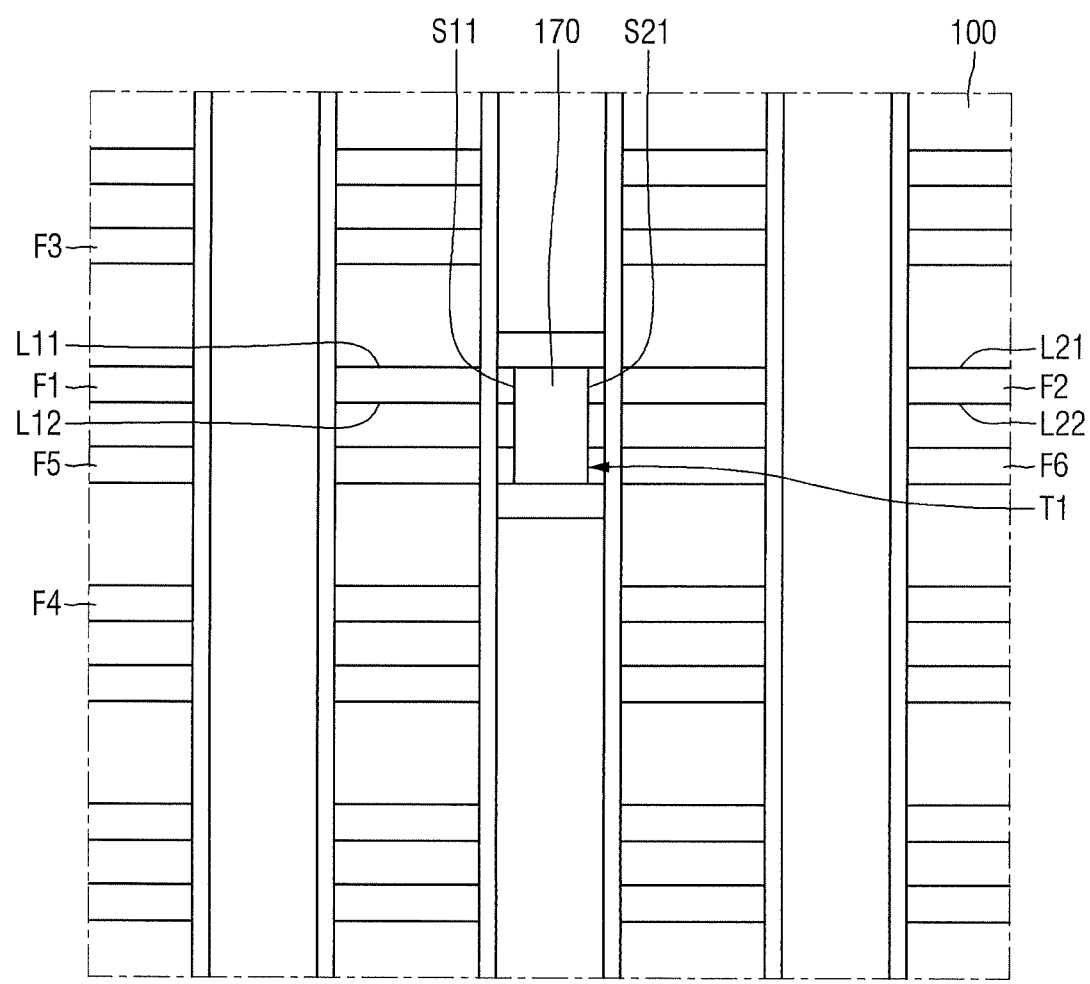
FIG. 2 is a layout view obtained by removing a first insulator from FIG. 1.

FIG. 1 is a layout view of a semiconductor device according to some embodiments. FIG. 2 is a layout view obtained by removing a first insulator 160_1 from FIG. 1. For clarity of illustration, a field insulating layer 105, a first interlayer insulating film 107, a second interlayer insulating film 109, a first source/drain region 191, a second source/drain region 192, and a first source/drain contact 210 are not illustrated in FIGS. 1 and 2.

Figure 3A:
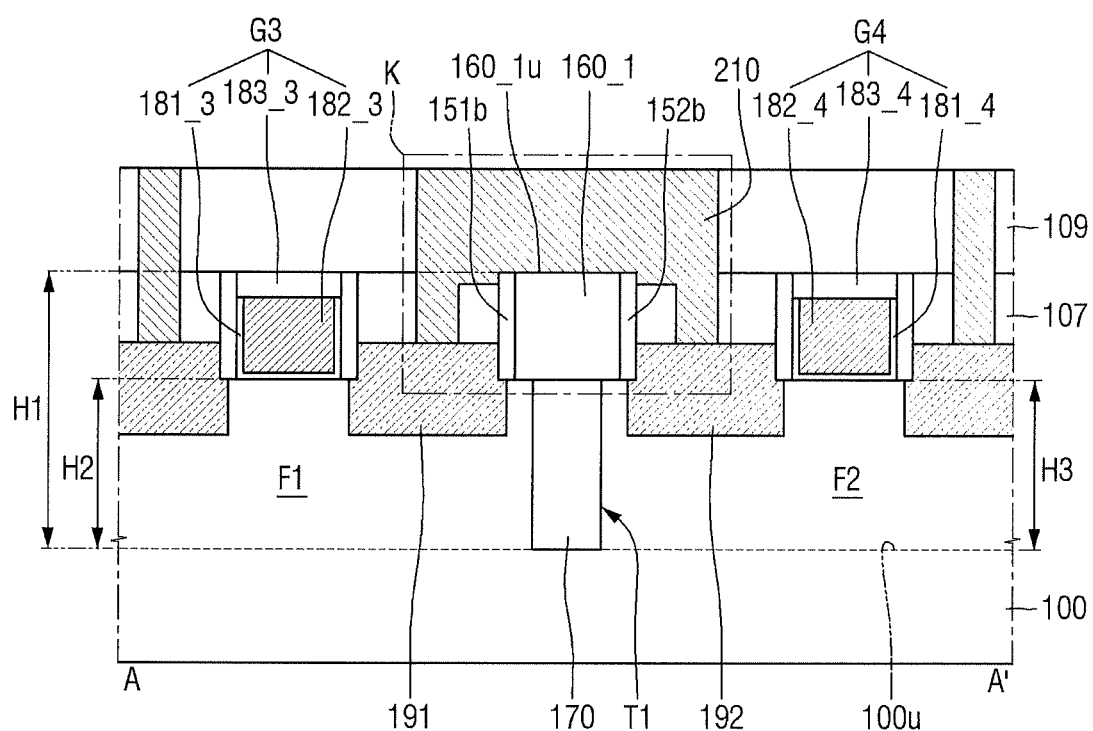
FIG. 3A is a cross-sectional view taken along the line A-A' of FIG. 1.
Figure 3B:
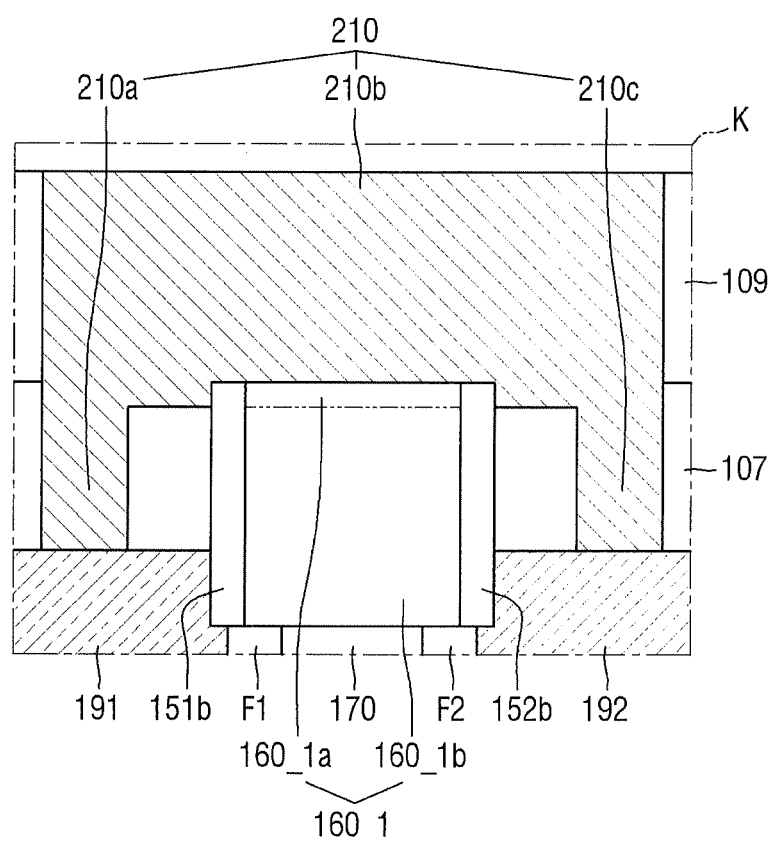
FIG. 3B is an enlarged view of an area 'k' in FIG. 3A.
Figure 4:
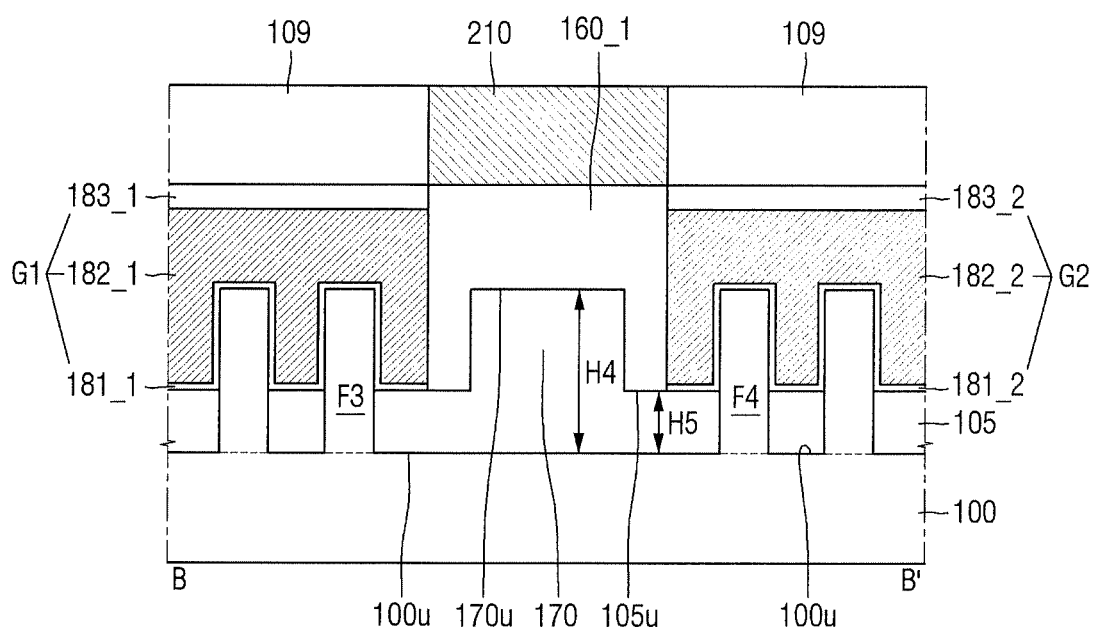
FIG. 4 is a cross-sectional view taken along the line B-B' of FIG. 1.
Figure 5:
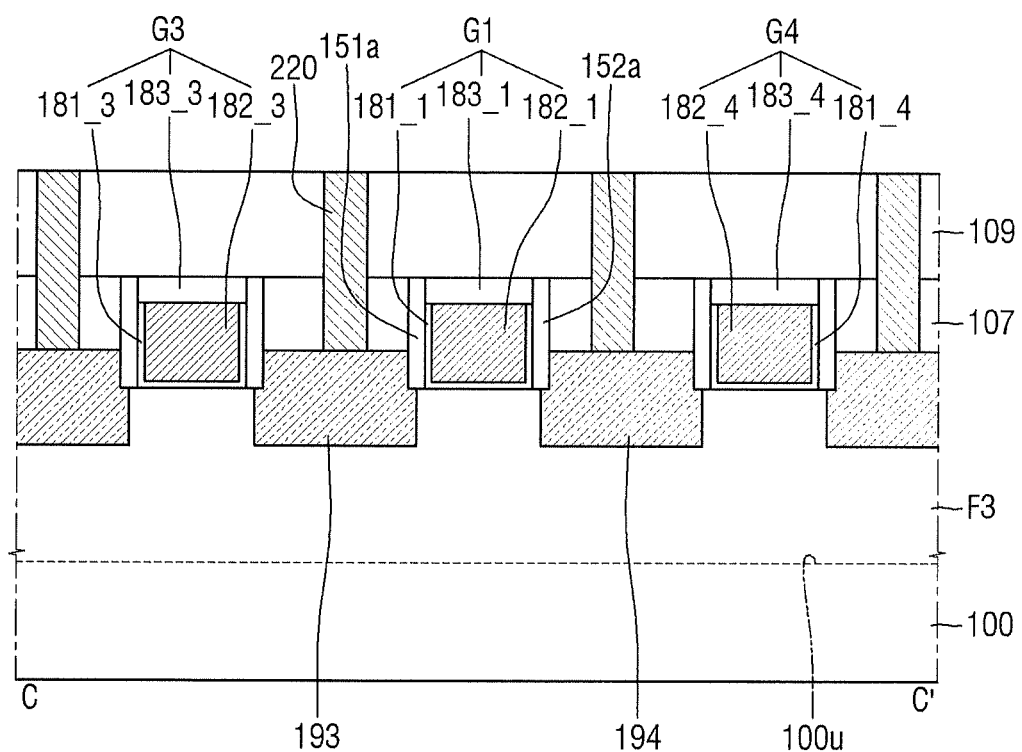
FIG. 5 is a cross-sectional view taken along the line C-C' of FIG. 1.

FIG. 3A is a cross-sectional view taken along the line A-A' of FIG. 1. FIG. 3B is an enlarged view of an area 'k' in FIG. 3A. FIG. 4 is a cross-sectional view taken along the line B-B' of FIG. 1. FIG. 5 is a cross-sectional view taken along the line C-C' of FIG. 1.

Referring to FIGS. 1 through 5, the semiconductor device according to some embodiments may include the first insulator 160_1, a first fin pattern F1, a second fin pattern F2, a third fin pattern F3, a fourth fin pattern F4, a first gate structure G1, and a second gate structure G2.

A substrate 100 may be a bulk silicon substrate or a silicon-on-insulator (SOI) substrate. Otherwise, the substrate 100 may be a silicon substrate or a substrate made of another material such as silicon germanium, silicon germanium on insulator (SGOI), indium antimonide, lead telluride, indium arsenide, indium phosphide, gallium arsenide or gallium antimonide.

The first insulator 160_1 may include a first side 161 and a second side 162 which face each other. The first side 161 and the second side 162 may extend in the same direction. In addition, the first insulator 160_1 may include a third side 163 and a fourth side 164 which connect the first side 161 and the second side 162 and face each other. Each of the third side 163 and the fourth side 164 may extend in a direction intersecting the direction in which the first side 161 and the second side 162 extend. The first insulator 1601 will be described in more detail later.

Each of first through sixth fin patterns F1, F2, F3, F4, F5, F6 may protrude from the substrate 100. Each of the first through sixth fin patterns F1, F2, F3, F4, F5, F6 may be disposed on the substrate 100 to extend along the direction in which the first side 161 and the second side 162 of the first insulator 160_1 extend. The first fin pattern F1 may include long sides L11 and L12 facing each other and extending in the direction in which the first side 161 and the second side 162 of the first insulator 160_1 extend and a short side S11 connecting the long sides L11 and L12. The first fin pattern F1 may extend from the third side 163 of the first insulator 160_1 in the direction in which the first side 161 and the second side 162 of the first insulator 160_1 extend. The second fin pattern F2 may include long sides L21 and L22 facing each other and extending in the direction in which the first side 161 and the second side 162 of the first insulator 160_1 extend and a short side S21 connecting the long sides L21 and L22. The short side S11 of the first fin pattern F1 and the short side S21 of the second fin pattern F2 may face each other. The second fin pattern F2 may extend from the fourth side 164 of the first insulator 160_1 in the direction in which the first side 161 and the second side 162 of the first insulator 160_1 extend.

Each of the third and fourth fin patterns F3 and F4 may be spaced apart from the first and second fin patterns F1 and F2 in the direction in which the third side 163 and the fourth side 164 of the first insulator 160_1 extend. The third and fourth fin patterns F3 and F4 may be spaced apart from each other. The third fin pattern F3 may be disposed adjacent to the first side 161 of the first insulator 160_1. The third fin pattern F3 may be spaced apart from the first side 161 of the first insulator 160_1 and extend in the direction in which the first side 161 of the first insulator 160_1 extends. The fourth fin pattern F4 may be disposed adjacent to the second side 162 of the first insulator 160_1. The fourth fin pattern F4 may be spaced apart from the second side 162 of the first insulator 160_1 and extend in the direction in which the second side 162 of the first insulator 160_1 extends.

The fifth and sixth fin patterns F5 and F6 may be spaced from each other in the direction in which the first side 161 and the second side 162 of the first insulator 160_1 extend. The fifth fin pattern F5 may extend from the third side 163 of the first insulator 160_1 in the direction in which the first side 161 and the second side 162 of the first insulator 160_1 extend. The sixth fin pattern F6 may extend from the fourth side 164 of the first insulator 160_1 in the direction in which the first side 161 and the second side 162 of the first insulator 160_1 extend.

The first fin pattern F1, the second fin pattern F2, the fifth fin pattern F5 and the sixth fin pattern F6 may be disposed between the third fin pattern F3 and the fourth fin pattern F4.

The first through sixth fin patterns F1, F2, F3, F4, F5, F6 may be part of the substrate 100 or may include an epitaxial layer grown from the substrate 100. Each of the first through sixth fin patterns F1, F2, F3, F4, F5, F6 may include an element semiconductor material such as silicon or germanium. In addition, each of the first through sixth fin patterns F1, F2, F3, F4, F5, F6 may include a compound semiconductor such as a group IV-IV compound semiconductor or a group III-V compound semiconductor. Specifically, the group IV-IV compound semiconductor that forms each of the first through sixth fin patterns F1, F2, F3, F4, F5, F6 may be, e.g., a binary or ternary compound including two or more of carbon (C), silicon (Si), germanium (Ge) and tin (Sn) or a compound obtained by doping the binary or ternary compound with a group IV element. The group III-V compound semiconductor that forms each of the first through sixth fin patterns F1, F2, F3, F4, F5, F6 may be, e.g., a binary, ternary, or quaternary compound composed of at least one of aluminum (Al), gallium (Ga) and indium (In) (i.e., group III elements) bonded with one of phosphorus (P), arsenic (As) and antimony (Sb) (i.e., group V elements).

The field insulating layer 105 may be disposed on the substrate 100. The field insulating layer 105 may partially cover the first through sixth fin patterns F1, F2, F3, F4. F5, and F6. For example, the field insulating layer 105 may partially cover sidewalls of the first through sixth fin patterns F1, F2, F3, F4, F5, and F6. A portion of each of the first through sixth fin patterns F1, F2, F3, F4, F5, and F6 may protrude above an upper surface 105U of the field insulating layer 105. The first through sixth fin patterns F1, F2, F3, F4, F5, and F6 may be defined by the field insulating layer 105 on the substrate 100. The field insulating layer 105 may include at least one of, for example, a silicon oxide layer, a silicon nitride layer, and a silicon oxynitride layer.

Each of first through fourth gate structures G1, G2, G3, and G4 may be formed on the substrate 100 to extend in the direction in which the third side 163 and the fourth side 164 of the first insulator 160_1 extend. The first through fourth gate structures G1, G2, G3, and G4 may be spaced apart from each other. The first gate structure G1 may be formed on the third fin pattern F3 to intersect the third fin pattern F3. The second gate structure G2 may overlap the fourth fin pattern F4 and intersect the fourth fin pattern F. The third gate structure G3 may intersect the first fin pattern F1, the third fin pattern F3 and the fourth fin pattern F4. The fourth gate structure G4 may intersect the second fin pattern F2, the third fin pattern F3 and the fourth fin pattern F4.

The first through fourth gate structures G1, G2, G3, and G4 may include first through fourth gate insulating layers 181_1, 181_2, 181_3, and 181_4, first through fourth gate electrodes 182_1, 182_2, 182_3, and 182_4, and first through fourth capping patterns 183_1, 183_2, 183_3, and 183_4, respectively.

The first gate insulating layer 181_1 may be formed along at least part of an inner wall of a first portion 151a of a first gate spacer, at least part of an inner wall of a first portion 152a of a second gate spacer, and an upper surface of the third fin pattern F3. The first gate insulating layer 181_1 may be disposed on the third fin pattern F3 and the field insulating layer 105. The first gate insulating layer 181_1 may be disposed along the profile of the third fin pattern F3 protruding above the upper surface 105U of the field insulating layer 105.

The second gate insulating layer 181_2 may be formed along at least part of an inner wall of a third portion 151c of the first gate spacer and at least part of an inner wall of a third portion 152c of the second gate spacer, and an upper surface of the fourth fin pattern F4. The second gate insulating layer 181_2 may be disposed on the fourth fin pattern F4 and the field insulating layer 105. The second gate insulating layer 181_2 may be disposed along the profile of the fourth fin pattern F4 protruding above the upper surface 105U of the field insulating layer 105.

The third gate insulating layer 181_3 may be disposed on at least part of inner walls of spacers disposed on both sidewalls of the third gate structure G3. The third gate insulating layer 181_3 may be disposed on, for example, the field insulating layer 105, the first fin pattern F1, the third fin pattern F3, the fourth fin pattern F4 and the fifth fin pattern F5. The third gate insulating layer 181_3 may be disposed along the profiles of the first fin pattern F1, the third fin pattern F3, the fourth fin pattern F4 and the fifth fin pattern F5 protruding above the upper surface 105U of the field insulating layer 105.

The fourth gate insulating layer 181_4 may be disposed on at least part of inner walls of spacers disposed on both sidewalls of the fourth gate structure G4. The fourth gate insulating layer 181_4 may be disposed on, for example, the field insulating layer 105, the second fin pattern F2, the third fin pattern F3, the fourth fin pattern F4 and the sixth fin pattern F6. The fourth gate insulating layer 181_4 may be disposed along the profiles of the second fin pattern F2, the third fin pattern F3, the fourth fin pattern F4 and the sixth fin pattern F6 protruding above the upper surface 105U of the field insulating layer 105.

In some embodiments, an interfacial layer may be further disposed between each of the first through fourth gate insulating layers 181_1, 181_2, 181_3, and 181_4 and each of the first through sixth fin patterns F1, F2, F3, F4, F5, F6. When the first through sixth fin patterns F1, F2, F3, F4, F5, F6 are silicon fin patterns, the interfacial layer may include, for example, silicon oxide.

The first through fourth gate insulating layers 181_1, 181_2, 181_3, and 181_4 may include a high dielectric constant material having a dielectric constant higher than that of a silicon oxide layer. For example, the first through fourth gate insulating layers 181_1, 181_2, 181_3, and 181_4 may include one or more of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

The first through fourth gate electrodes 182_1, 182_2, 182_3, and 182_4 may be disposed on the first through fourth gate insulating layers 181_1, 181_2, 181_3, and 181_4, respectively.

The first through fourth gate electrodes 182_1, 182_2, 182_3, and 182_4 may include at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and combinations of the same.

The first through fourth capping patterns 183_1, 183_2, 183_3, and 183_4 may be disposed on the first through fourth gate electrodes 182_1, 182_2, 182_3, and 182_4, respectively. The first through fourth capping patterns 183_1, 183_2, 183_3, and 183_4 may include a material having an etch selectivity with respect to the first interlayer insulating film 107. The first through fourth capping patterns 183_1, 183_2, 183_3, and 183_4 may include at least one of, for example, silicon oxide ($SiO_2$), silicon nitride (SiN), silicon oxynitride (SiON), silicon carbonitride (SiCN), and silicon oxycarbonitride (SiOCN).

In the drawings, the first through fourth gate insulating layers 181_1, 181_2, 181_3, and 181_4 do extend between the first through fourth capping patterns 183_1, 183_2, 183_3, and 183_4 and gate spacers disposed on both sidewalls of the first through fourth gate structures G1, G2, G3, and G4. However, the inventive concept is not limited to this case.

Referring to FIG. 4, the first and second gate insulating layers 181_1 and 181_2 may not be formed between the first insulator 160_1 and the first and second gate electrodes 182_1 and 182_2 and between the first insulator 160_1 and the first and second capping patterns 183_1 and 183_2. In a process of manufacturing the semiconductor device according to some embodiments, the first insulator 160_1 may be formed by removing a portion of a gate structure extending continuously between the first gate spacer 152a, 152b, and 152c and the second gate spacer 152a, 152b, and 152c which will be described later. The removed portion of the gate structure may be, for example, a portion disposed between a second portion 151b of the first gate spacer and a second portion 152b of the second gate spacer.

In some embodiments, the removing of the portion of the gate structure may be performed after the formation of a metal gate electrode. In this case, the first and second gate insulating layers 181_1 and 181_2 may already be formed before the portion of the gate structure is removed to form the first insulator 160_1. Therefore, the first and second gate insulating layers 181_1 and 181_2 may not be formed between the first insulator 160_1 and the first and second gate electrodes 182_1 and 182_2 and between the first insulator 160_1 and the first and second capping patterns 183_1 and 183_2. As a result of removing the portion of the gate structure, the gate structure extending continuously between the first gate spacer 151a, 151b, and 151c and the second gate spacer 152a, 152b, and 152c may be divided into the first gate structure G1 and the second gate structure G2. The first gate structure G1 and the second gate structure G2 may be insulated from each other by the first insulator 160_1. The first gate spacer 151a, 151b, and 151c and the second gate spacer 152a, 152b, and 152c will be described in more detail later.

The first insulator 160_1 may be disposed between the first gate structure G1 and the second gate structure G2 to connect the first gate structure G1 and the second gate structure G2. The first side 161 of the first insulator 160_1 may directly contact the first gate structure G1. The second side 162 of the first insulator 160_1 may directly contact the second gate structure G2. For example, the first gate structure G1 may extend from the first side 161 in the direction in which the third side 163 and the fourth side 164 extend. The second gate structure G2 may extend from the second side 162 in the direction in which the third side 163 and the fourth side 164 extend.

The first gate spacer 151a, 151b, and 151c may include the first portion 151a, the second portion 151b and the third portion 151c arranged in the direction in which the third side 163 and the fourth side 164 of the first insulator 160_1 extend. In some embodiments, the first portion 151a, the second portion 151b, and the third portion 151c of the first gate spacer may be connected to each other.

The second gate spacer 152a, 152b, and 152c may include the first portion 152a, the second portion 152b and the third portion 152c arranged in the direction in which the third side 163 and the fourth side 164 of the first insulator 160_1 extend. The first portion 152a, the second portion 152b and the third portion 152c of the second gate spacer may be connected to each other.

The first gate spacer 151a, 151b, and 151c and the second gate spacer 152a, 152b, and 152c may be spaced apart from each other and may extend from the first gate structure G1 to the second gate structure G2 via the first insulator 160_1. The first gate structure G1 may be disposed between the first portion 151a of the first gate spacer and the first portion 152a of the second gate spacer. The first insulator 160_1 may be disposed between the second portion 151b of the first gate spacer and the second portion 152b of the second gate spacer. The second gate structure G2 may be disposed between the third portion 151c of the first gate spacer and the third portion 152c of the second gate spacer.

Each of the first gate spacer 151a, 151b, and 151c and the second gate spacer 152a, 152b, and 152c may include at least one of, for example, silicon nitride (SiN), silicon oxynitride (SiON), silicon oxide ($SiO_2$), and silicon oxycarbonitride (SiOCN).

The first insulator 160_1 may be disposed between the first fin pattern F1 and the second fin pattern F2 and between the fifth fin pattern F5 and the sixth fin pattern F6. For example, the first insulator 160_1 may be disposed between the first source/drain region 191 and the second source/drain region 192. The first insulator 160_1 may be disposed on a pattern 170. The first insulator 160_1 may be disposed on the field insulating layer 105 to cover the pattern 170. The pattern 170 will be described in more detail later.

A first width W1 of the first insulator 160_1 may be substantially equal to a second width W2 of the first gate structure G1 and a third width W3 of the second gate structure G2. The first width W1 of the first insulator 160_1 may be a value measured from the third side 163 to the fourth side 164. The second width W2 of the first gate structure G1 may be a value measured from the inner wall of the first portion 151a of the first gate spacer to the inner wall of the first portion 152a of the second gate spacer. The third width W3 of the second gate structure G2 may be a value measured from the inner wall of the third portion 151c of the first gate spacer to the inner wall of the third portion 152c of the second gate spacer.

An upper surface 160_1U of the first insulator 160_1 may be higher than an upper surface of the first fin pattern F1 and an upper surface of the second fin pattern F2. For example, a first height H1 from the upper surface 100U of the substrate 100 to the upper surface 160_1U of the first insulator 160_1 may be greater than a height H2 from the upper surface 100U of the substrate 100 to the upper surface of the first fin F1 and a third height H3 from the upper surface 100U of the substrate 100 to the upper surface of the second fin pattern F2.

The first insulator 160_1 may include at least one of, for example, silicon oxide ($SiO_2$), silicon nitride (SiN), silicon oxynitride (SiON), silicon carbonitride (SiCN), and silicon oxycarbonitride (SiOCN).

The pattern 170 may fill a trench T1 that defines the short side S11 of the first fin pattern F1 and the short side S21 of the second fin pattern F2. The pattern 170 may be disposed between the first fin pattern F1 and the second fin pattern F2 and between the fifth fin pattern F5 and the sixth fin pattern F6. The first fin pattern F1 and the second fin pattern F2 may be insulated from each other by the pattern 170. The fifth fin pattern F5 and the sixth fin pattern F6 may be insulated from each other by the pattern 170.

While a case where the pattern 170 is disposed between the first fin pattern F1 and the second fin pattern F2 and between the fifth fin pattern F5 and the sixth fin pattern F6 and where each of the third fin pattern F3 and the fourth fin pattern F4 is a single continuous fin pattern has been described above as an example, the technical spirit of the inventive concept is not limited to this case. For example, the pattern 170 may extend in the direction in which the third side 163 and the fourth side 164 of the first insulator 160_1 extend and divide at least any one of the third fin pattern F3 and the fourth fin pattern F4 into two fin patterns.

In some embodiments, the pattern 170 may include the same material as the field insulating layer 105. In other words, the field insulating layer 105 may include the pattern 170 protruding from the upper surface 105U of the field insulating layer 105.

An upper surface 170U of the pattern 170 may be higher than the upper surface 105U of the field insulating layer 105. For example, a fourth height H4 from the upper surface 100U of the substrate 100 to the upper surface 170U of the pattern 170 may be greater than a fifth height H5 from the upper surface 100U of the substrate 100 to the upper surface 105U of the field insulating layer 105.

The first or second source/drain region 191 or 192 may be disposed on at least one side of the first insulator 160_1. For example, the first source/drain region 191 may be disposed on a side of the first insulator 160_1, and the second source/drain region 192 may be disposed on the other side of the first insulator 160_1. The first source/drain region 191 may be disposed between the third side 163 of the first insulator 160_1 and the third gate structure G3. The second source/drain region 192 may be disposed between the fourth side 164 of the first insulator 160_1 and the fourth gate structure G4. The first source/drain region 191, the first insulator 160_1 and the second source/drain region 192 may be arranged along the direction in which the first side 161 and the second side 162 of the first insulator 160_1 extend. The first source/drain region 191 may be disposed on the first fin pattern F1, and the second source/drain region 192 may be disposed on the second fin pattern F2. The first source/drain region 191 may be included in a source/drain of a transistor that uses the first fin pattern F1 as a channel region, and the second source/drain region 192 may be included in a source/drain of a transistor that uses the second fin pattern F2 as a channel region.

A third source/drain region 193 may be disposed on a side of the first gate structure G1, and a fourth source/drain region 194 may be disposed on the other side of the first gate structure G1. The third source/drain region 193 and the fourth source/drain region 194 may be disposed on the third fin pattern F3.

Since the first insulator 160_1 is disposed in a so-called active region in which the first source/drain region 191 and the second source/drain region 192 are disposed, it may be unnecessary to place an additional insulator, which does not overlap fin patterns, in order to divide the gate structure extending continuously between the first gate spacer 151a, 151b, and 151c and the second gate spacer 152a, 152b, and 152c. Therefore, the gap between the fin patterns can be reduced, and the degree of integration of the semiconductor device can be improved.

Due to the first insulator 160_1, the first gate structure G1 and the second gate structure G2 may respectively be included in transistors having different conductivity types. For example, a first transistor may include the first gate structure G1 and the third fin pattern F3, and a second transistor may include the second gate structure G2 and the fourth fin pattern F4. Here, since the first gate structure G1 and the second gate structure G2 are separated and insulated from each other by the first insulator 160_1, the first transistor and the second transistor can have different conductivity types.

In some embodiments, the substrate 100 may include an n-channel metal oxide semiconductor (NMOS) region and a p-channel metal oxide semiconductor (PMOS) region. The NMOS region may be a region in which an n-type transistor is disposed, and the PMOS region may be a region in which a p-type transistor is disposed. Although the first insulator 160_1 is disposed in the so-called active region in which the first source/drain region 191 and the second source/drain region 192 are disposed, since the first insulator 160_1 insulates the first gate structure G1 and the second gate structure G2 from each other, the NMOS region and the PMOS region may be separated from each other.

The first interlayer insulating film 107 may cover the first through fourth source/drain regions 191, 192, 193 and 194. The first interlayer insulating film 107 may be formed around the first insulator 160_1 and the first through fourth gate structures G1, G2, G3, and G44. The first interlayer insulating film 107 may cover the first insulator 160_1 and at least partially cover the sidewalls of the first through fourth gate structures G1, G2, G3, and G4. The second interlayer insulating film 109 may be disposed on the first interlayer insulating film 107.

Each of the first interlayer insulating film 107 and the second interlayer insulating film 109 may include, but not limited to, silicon oxide, silicon nitride, silicon oxynitride, flowable oxide (FOX), tonen silazen (TOSZ), undoped silicate glass (USG), borosilicate glass (BSG), phosphosilicate glass (PSG), borophosphosilicate glass (BPSG), plasma enhanced tetraethylorthosilicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, a porous polymeric material, or a combination of the same.

The first source/drain contact 210 may pass through the first interlayer insulating film 107 and the second interlayer insulating film 109 to contact the first source/drain region 191 and the second source/drain region 192.

The first source/drain contact 210 may include a first portion 210a, a second portion 210b, and a third portion 210c. Each of the first portion 210a and the third portion 210c of the first source/drain contact 210 may include a portion contacting the first source/drain region 191 and/or the second source/drain region 192. In some embodiments, each of the first portion 210a and the third portion 210c of the first source/drain contact 210 may include a portion extending in a direction upward from the upper surface 100U of the substrate 100. The second portion 210b of the first source/drain contact 210 may be disposed on the first insulator 160_1 to extend in the direction in which the first side 161 and the second side 162 of the first insulator 160_1 extend and may connect the first portion 210a and the third portion 210c.

In some embodiments, the first insulator 160_1 may include a first portion 160_1a and a second portion 160_1b. The first portion 160_1a of the first insulator 160_1 may be a portion inserted into the second portion 210b of the first source/drain contact 210. The second portion 160_1b of the first insulator 160_1 may be a portion disposed between the first portion 160_1a of the first insulator 160_1 and the pattern 170.

The first source/drain contact 210 may include, for example, a conductive material. In some embodiments, the first source/drain contact 210 may include any one of cobalt and tungsten.

A second source/drain contact 220 may be disposed on the third source/drain region 193. For example, the second source/drain contact 220 may pass through the first interlayer insulating film 107 and the second interlayer insulating film 109 to contact the third source/drain region 193. In some embodiments, a contact for directly connecting the third source/drain region 193 (i.e., the second source/drain contact 220) and the fourth source/drain region 194 may not be disposed on the first gate structure G1.

In the semiconductor device according to some embodiments, the second portion 210b of the first source/drain contact 210 which directly connects the first source/drain region 191 and the second source/drain region 192 may be disposed on the first insulator 160_1. However, a source/drain contact which directly connects the third source/drain region 193 and the fourth source/drain region 194 may not be disposed on the first gate structure G1. When the second portion 210b of the first source/drain contact 210 which directly connects the first source/drain region 191 and the second source/drain region 192 is disposed on the first insulator 160_1, the possibility of a short circuit between a gate electrode and source/drain contact is eliminated, thereby improving the reliability of the semiconductor device.

Figure 6:
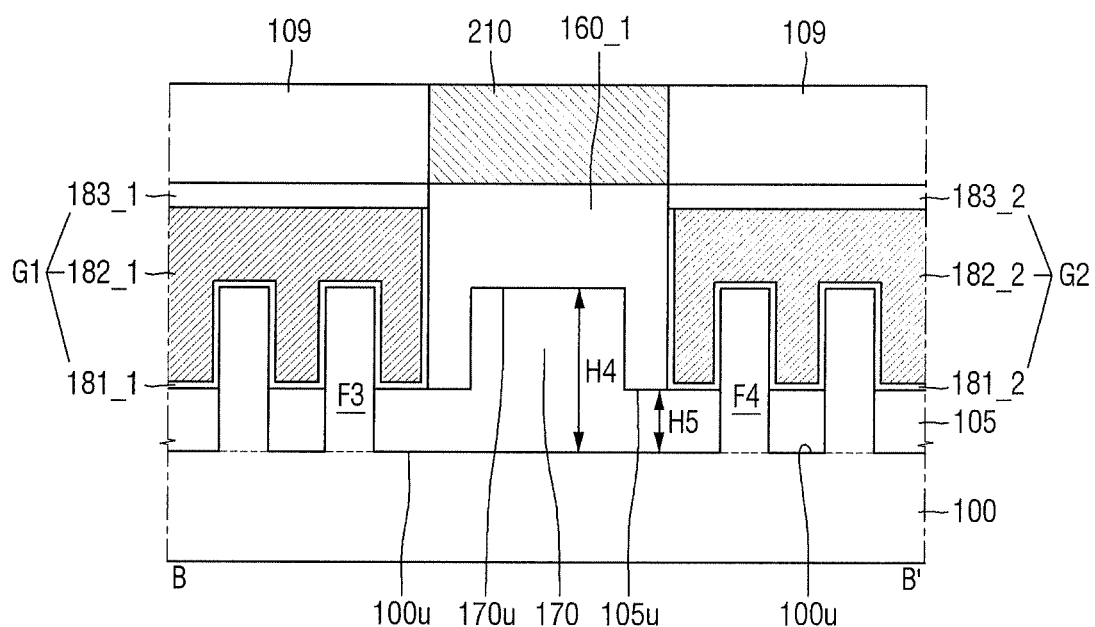
FIG. 6 is a cross-sectional view taken along the line B-B' of FIG. 1.

FIG. 6 is a cross-sectional view taken along the line B-B' of FIG. 1. For ease of description, differences from the above description will be mainly described.

Referring to FIGS. 1 and 6, in some embodiments of a process of manufacturing a semiconductor device according to the technical spirit of the inventive concept, a portion of a gate structure extending continuously between a first gate spacer 151a, 151b, and 151c and a second gate spacer 152a, 152b, and 152c may be removed to form a first insulator 160_1 before the formation of a metal gate electrode. In this case, first and second gate insulating layers 181_1 and 181_2 may be formed after the first insulator 160_1 is formed. Therefore, the first and second gate insulating layers 181_1 and 181_2 may be formed between the first insulator 160_1 and first and second gate electrodes 182_1 and 182_2 and between the first insulator 160_1 and first and second capping patterns 183_1 and 183_2.

Figure 7:
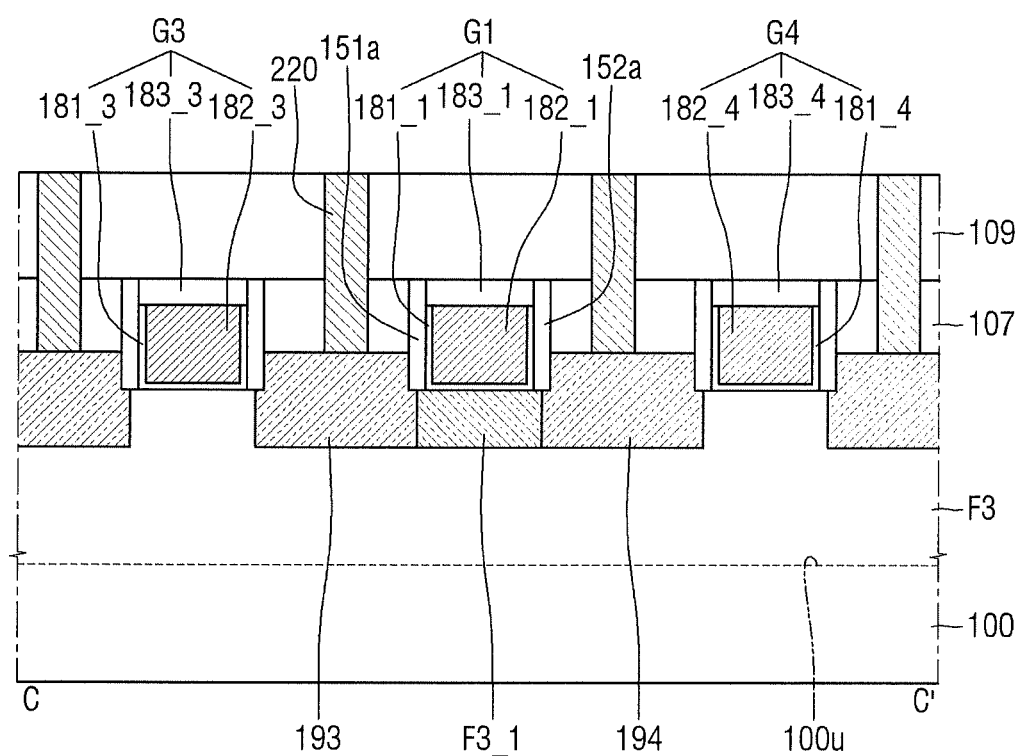
FIG. 7 is a cross-sectional view taken along the line C-C' of FIG. 1.

FIG. 7 is a cross-sectional view taken along the line C-C' of FIG. 1. For ease of description, differences from the above description will be mainly described.

Referring to FIGS. 1 and 7, a third source/drain region 193 and a fourth source/drain region 194 may be connected to each other.

A third fin pattern F3 may include a first portion F3_1 between the third source/drain region 193 and the fourth source/drain region 194. The third source/drain region 193 and the fourth source/drain region 194 may be connected by the first portion F3_1 of the third fin pattern F3. The first portion F3_1 of the third fin pattern F3 may be a portion heavily doped with a dopant implanted into the third source/drain region 193 and the fourth source/drain region 194.

Due to the first portion F3_1 of the third fin pattern F3, the third source/drain region 193 and the fourth source/drain region 194 may always be electrically connected regardless of whether a transistor including a first gate structure G1, the third source/drain region 193 and the fourth source/drain region 194 is turned on or off.

Figure 8:
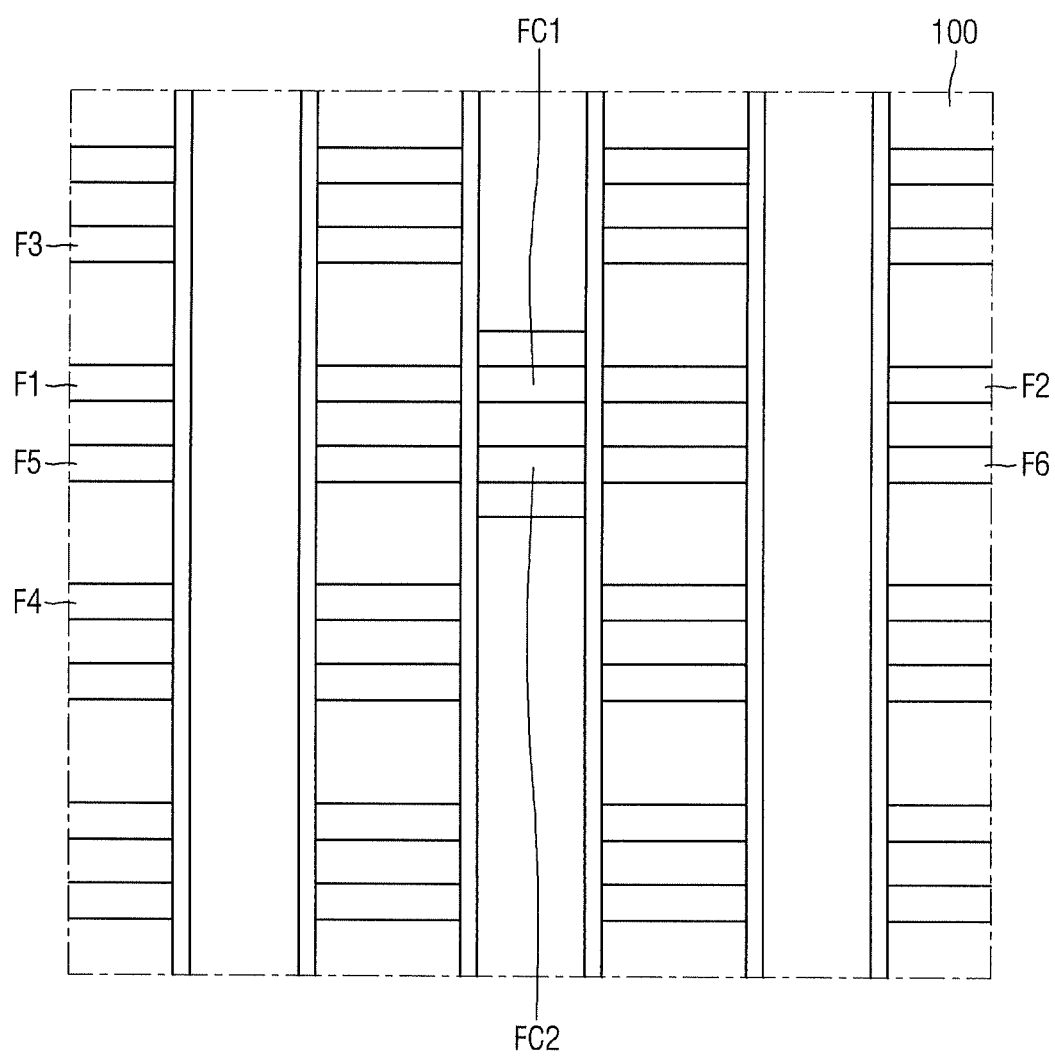
FIG. 8 is a layout view obtained by removing a first insulator from FIG. 1.

FIG. 8 is a layout view obtained by removing a first insulator 160_1 from FIG. 1. For clarity of illustration, a field insulating layer 105, a first interlayer insulating film 107, a second interlayer insulating film 109, a first source/drain region 191, a second source/drain region 192, and a first source/drain contact 210 are not illustrated in FIG. 8.

Figure 9:
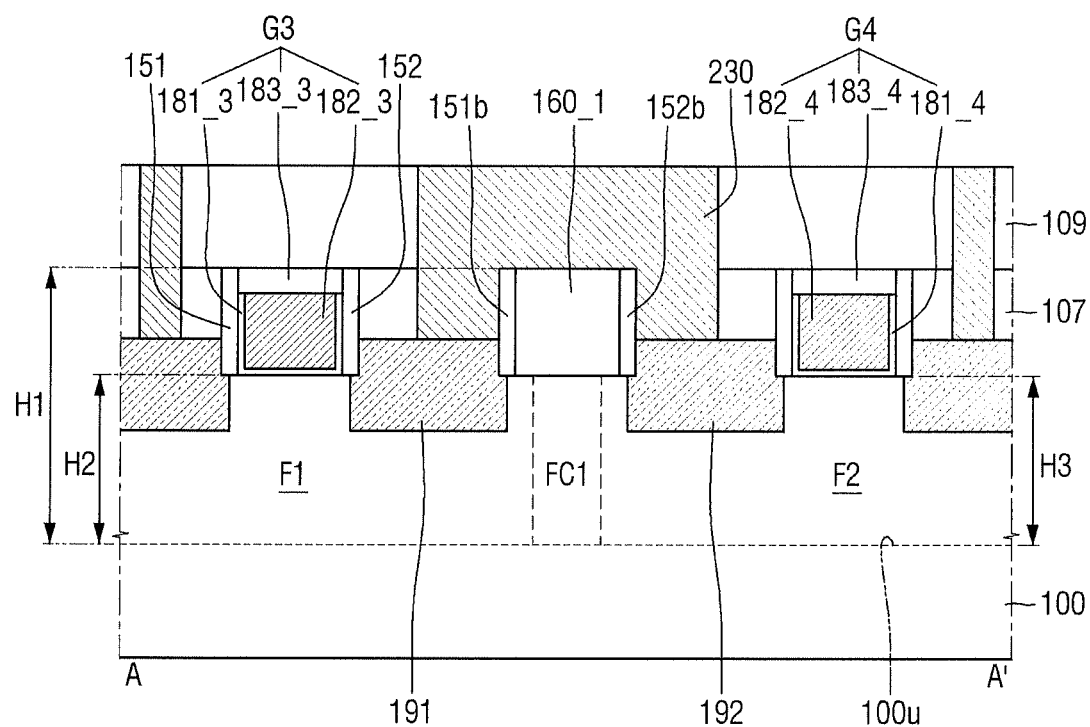
FIG. 9 is a cross-sectional view taken along the line A-A' of FIG. 1.
Figure 10:
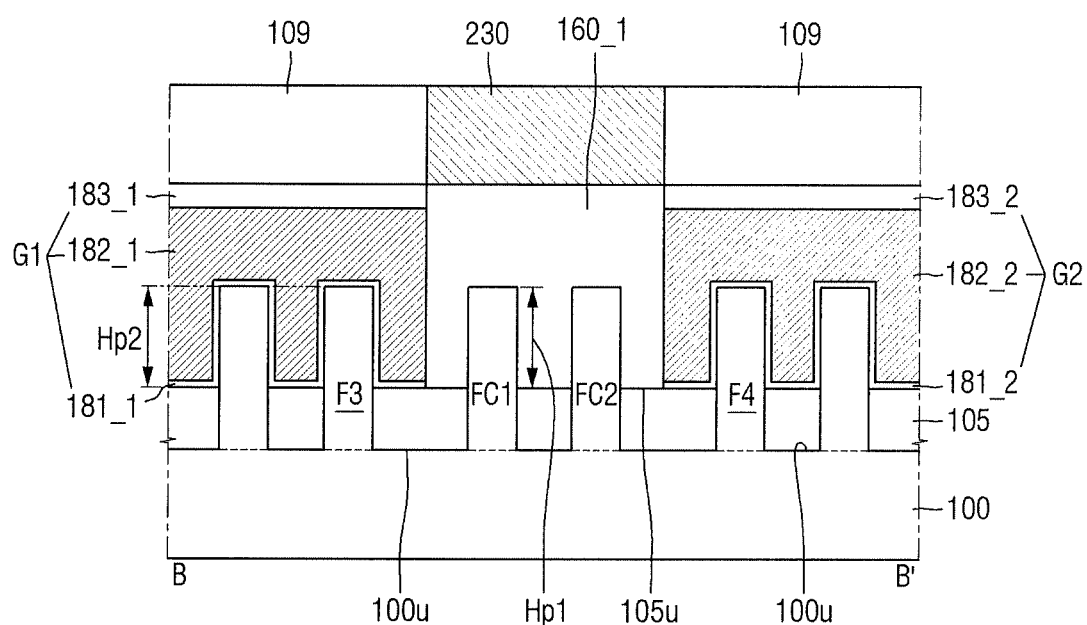
FIGS. 10 through 12 are respectively cross-sectional views taken along the line B-B' of FIG. 1.
Figure 11:
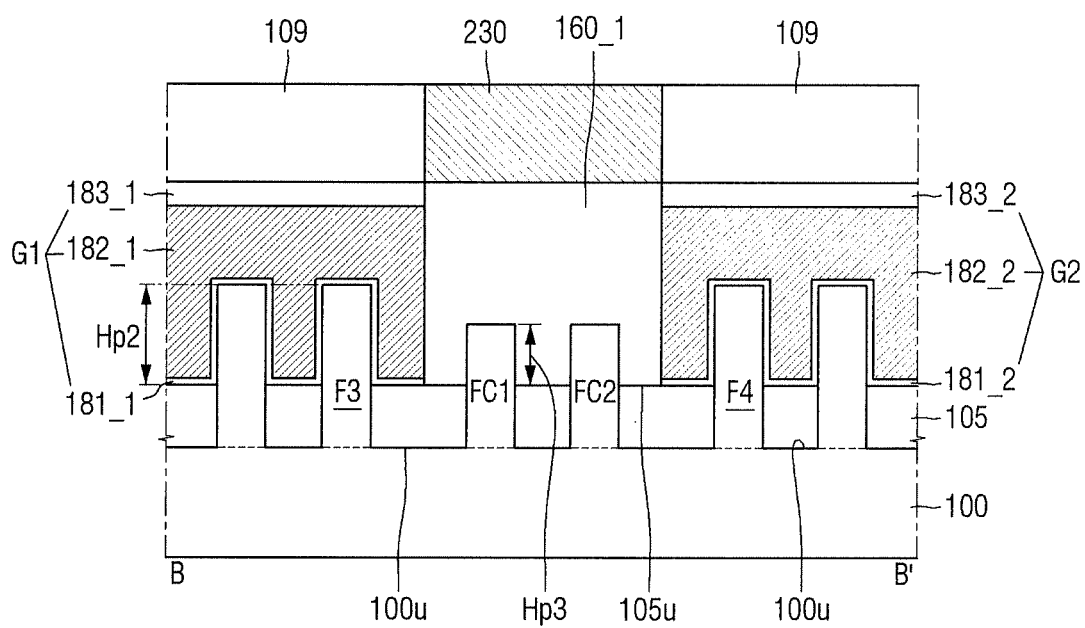

FIG. 9 is a cross-sectional view taken along the line A-A' of FIG. 1. FIGS. 10 and 11 are respectively cross-sectional views taken along the line B-B' of FIG. 1. For ease of description, differences from the above description will be mainly described.

Referring to FIGS. 1, 8, 9, 10 and 11, a first fin pattern F1 and a second fin pattern F2 may be connected by a first connection fin pattern FC1. A fifth fin pattern F5 and a sixth fin pattern F6 may be connected by a second connection fin pattern FC2.

The first connection fin pattern FC1 may be disposed between the first fin pattern F1 and the second fin pattern F2. The second connection fin pattern FC2 may be disposed between the fifth fin pattern F5 and the sixth fin pattern F6. The first connection fin pattern FC1 and the second connection fin pattern FC2 may be disposed under the first insulator 160_1. The first insulator 160_1 may be disposed on the field insulating layer 105 to cover the first connection fin pattern FC1 and the second connection fin pattern FC2.

Since the first connection fin pattern FC1 connects the first fin pattern F1 and the second fin pattern F2, the first fin pattern F1 and the second fin pattern F2 may be shaped like a single continuous fin extending along a direction in which a first side 161 and a second side 162 of the first insulator 160_1 extend.

The first connection fin pattern FC1 and the second connection fin pattern FC2 may include a different material from that of the field insulating layer 105.

In a process of manufacturing a semiconductor device according to some embodiments, a portion of a gate structure extending continuously between a first gate spacer 151a, 151b, and 151c and a second gate spacer 152a, 152b, and 152c may be removed after the formation of a metal gate electrode. In this case, as described above, first and second gate insulating layers 181_1 and 181_2 may not be formed between the first insulator 160_1 and first and second gate electrodes 182_1 and 182_2 and between the first insulator 160_1 and first and second capping patterns 183_1 and 183_2.

In some embodiments, a height Hp1 of the first connection fin pattern FC1 may be substantially equal to a height Hp2 of a third fin pattern F3, as illustrated in FIG. 10. The height Hp1 of the first connection fin pattern FC1 may be a value measured from an upper surface 100U of a substrate 100 to an upper surface of the first connection fin pattern FC1. In addition, the height Hp2 of the third fin pattern F3 may be a value measured from the upper surface 100U of the substrate 100 to an upper surface of the third fin pattern F3.

In some embodiments, a height Hp3 of the first connection fin pattern FC1 may be smaller than the height Hp2 of the third fin pattern F3, as illustrated in FIG. 11. For example, when a portion of the gate structure extending continuously between the first gate spacer 151a, 151b, 151c and the second gate spacer 152a, 152b, 152c is removed, at least a portion of the first connection fin pattern FC1 and at least a portion of the second connection fin pattern FC2 may also be removed. In this case, the height Hp3 of the first connection fin pattern FC1 may be smaller than the height Hp2 of the third fin pattern F3.

Figure 12:
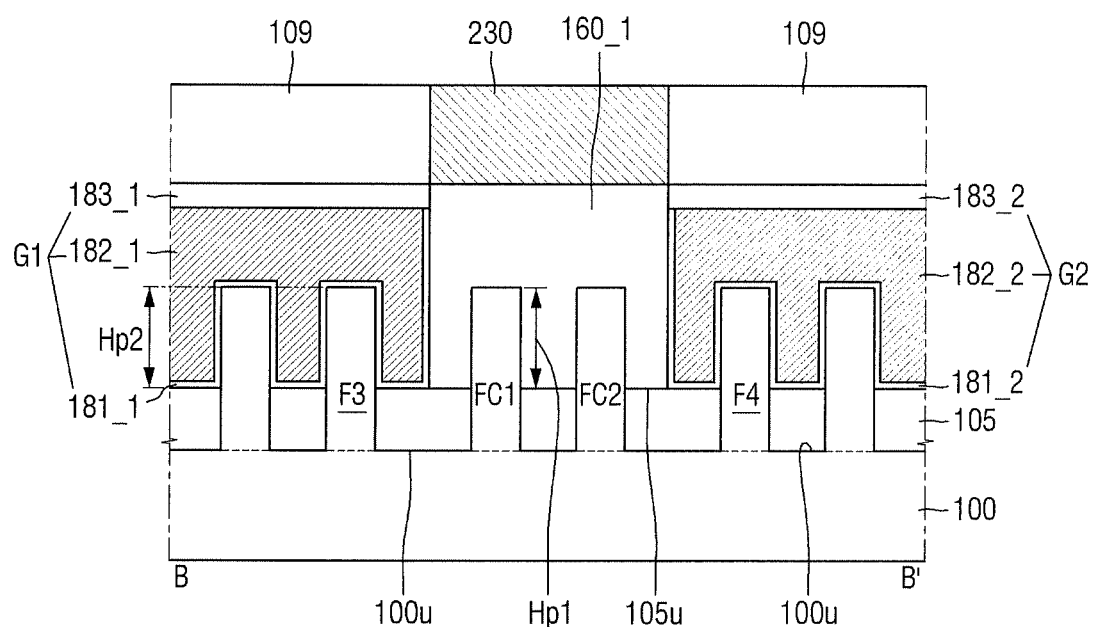

FIG. 12 is a cross-sectional view taken along the line B-B' of FIG. 1. For ease of description, differences from the above description will be mainly described.

Referring to FIGS. 1 and 12, in a process of manufacturing a semiconductor device according to some embodiments, a portion of a gate structure extending continuously between a first gate spacer 151a, 151b, 151c and a second gate spacer 152a, 152b, 152c may be removed before the formation of a metal gate electrode. In this case, as described above, first and second gate insulating layers 181_1 and 181_2 may be formed between a first insulator 160_1 and first and second gate electrodes 182_1 and 182_2 and between the first insulator 160_1 and first and second capping patterns 183_1 and 183_2.

Figure 13:
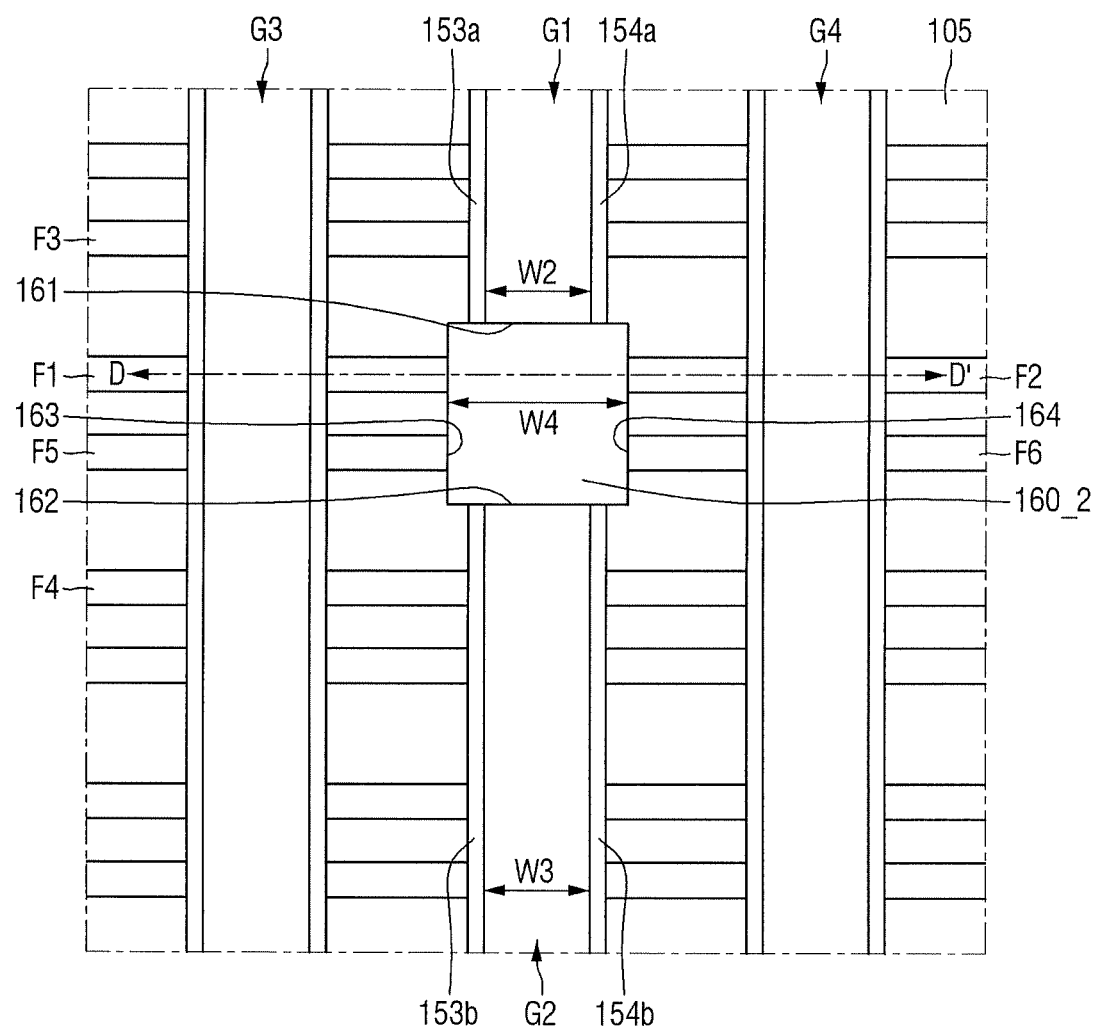
FIG. 13 is a layout view of a semiconductor device according to some embodiments.

FIG. 13 is a layout view of a semiconductor device according to some embodiments. For clarity of illustration, a field insulating layer 105, a first interlayer insulating film 107, a second interlayer insulating film 109, a first source/drain region 191, a second source/drain region 192, and a first source/drain contact 210 are not illustrated in FIG. 13.

Figure 14:
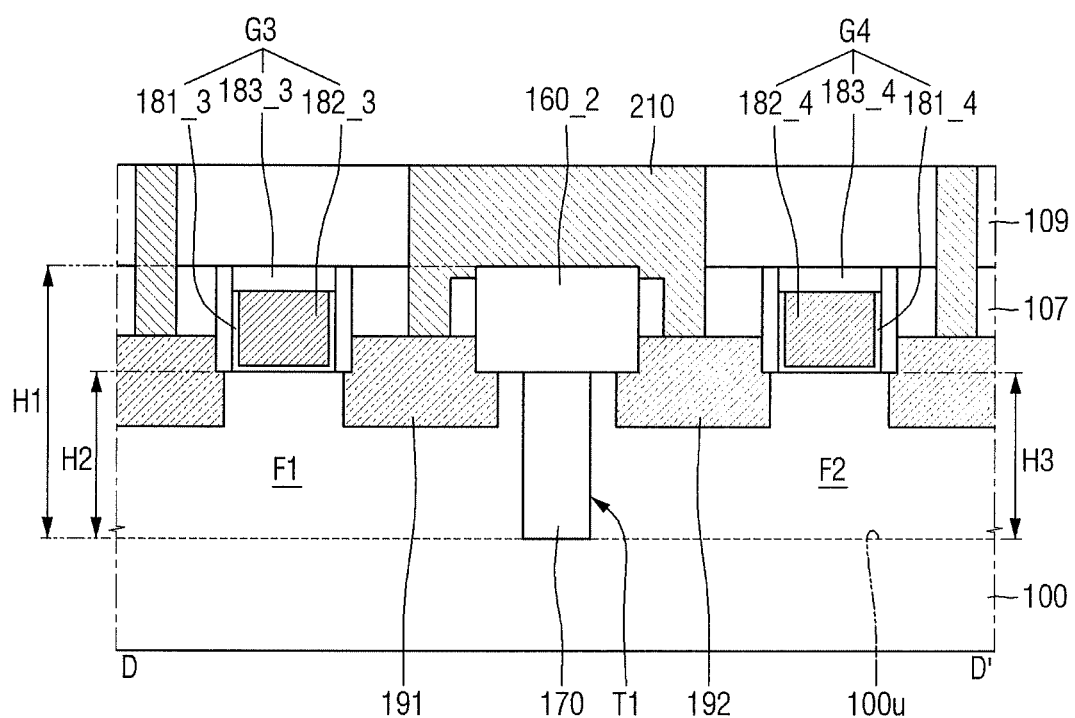
FIGS. 14 and 15 are respectively cross-sectionals view taken along the line D-D' of FIG. 13.

FIG. 14 is a cross-sectional view taken along the line D-D' of FIG. 13. For ease of description, differences from the above description will be mainly described.

Referring to FIGS. 13 and 14, a fourth width W4 of a second insulator 160_2 may be greater than a second width W2 and a third width W3.

A third gate spacer may include a first portion 153a and a second portion 153b arranged in a direction in which a third side 163 and a fourth side 164 of the second insulator 160_2 extend. A fourth gate spacer 154a and 154b may include a first portion 154a and a second portion 154b arranged in the direction in which the third side 163 and the fourth side 164 of the second insulator 160_2 extend.

The first portion 153a and the second portion 153b of the third gate spacer may be spaced apart from each other by the second insulator 160_2. In addition, the first portion 154a and the second portion 154b of the fourth gate spacer may be spaced apart from each other by the second insulator 160_2. The second insulator 160_2 may be disposed between the first portion 153a and the second portion 153b of the third gate spacer and between the first portion 154a and the second portion 154b of the fourth gate spacer. The third gate spacer 153a and 153b and the fourth gate spacer 154a and 154b may not be formed on the third side 163 and the fourth side 164 of the second insulator 160_2.

In FIG. 13, the fourth width W4 of the second insulator 160_2 is greater than a width from an outer wall of the first portion 153a of the third gate spacer to an outer wall of the first portion 154a of the fourth gate spacer. However, the inventive concept is not limited to this case. For example, the width of the second insulator 160_2 may be substantially equal to the width from the outer wall of the first portion 153a of the third gate spacer to the outer wall of the first portion 154a of the fourth gate spacer.

The second insulator 160_2 may be disposed on a pattern 170. In addition, the second insulator 160_2 may cover the pattern 170.

Figure 15:
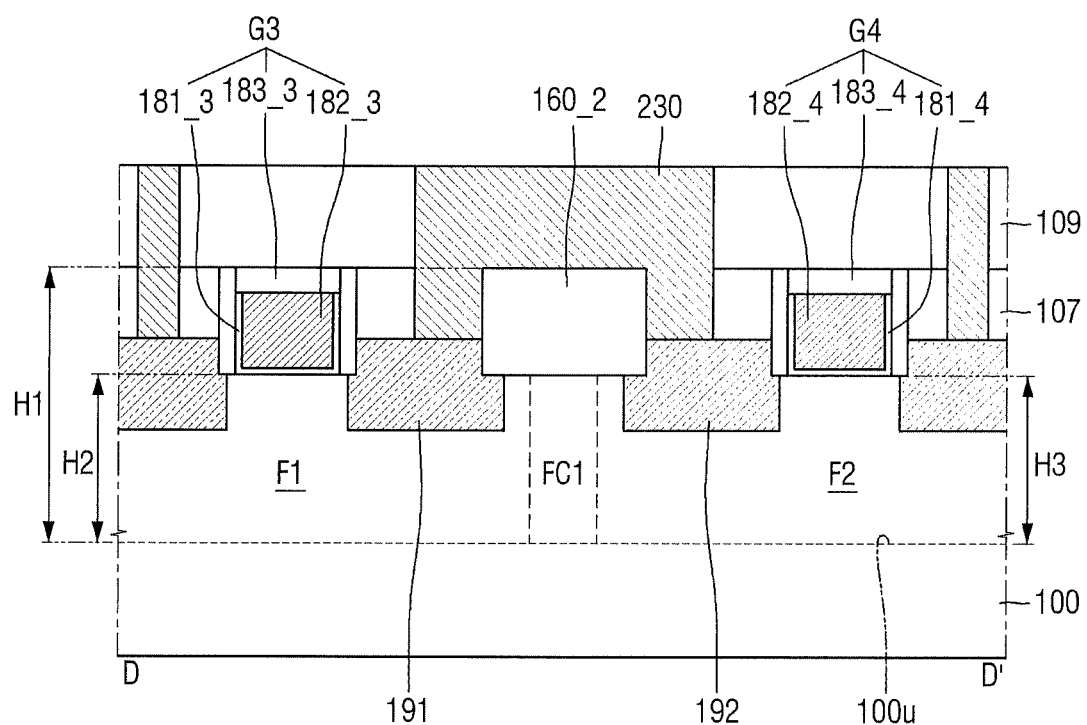

FIG. 15 is a cross-sectional view taken along the line D-D' of FIG. 13. For ease of description, differences from the above description will be mainly described.

Referring to FIGS. 13 and 15, a second insulator 160_2 may be disposed on a first connection fin pattern FC1. The second insulator 160_2 may cover the first connection fin pattern FC1.

Figure 16:
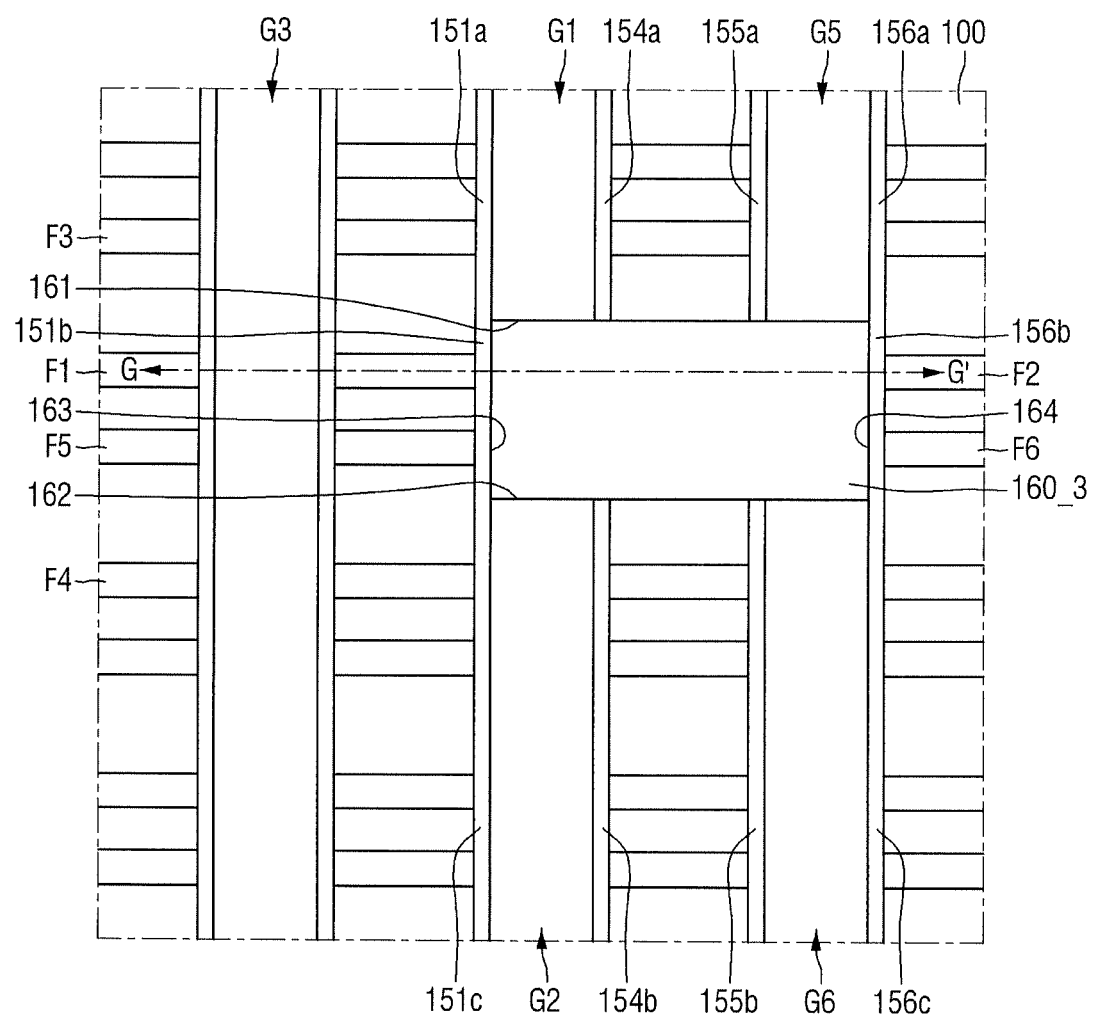
FIG. 16 is a layout view of a semiconductor device according to some embodiments.

FIG. 16 is a layout view of a semiconductor device according to some embodiments. For clarity of illustration, a field insulating layer 105, a first interlayer insulating film 107, a second interlayer insulating film 109, a first source/drain region 191, a fifth source/drain region 195, and a first source/drain contact 210 are not illustrated in FIG. 16.

Figure 17:
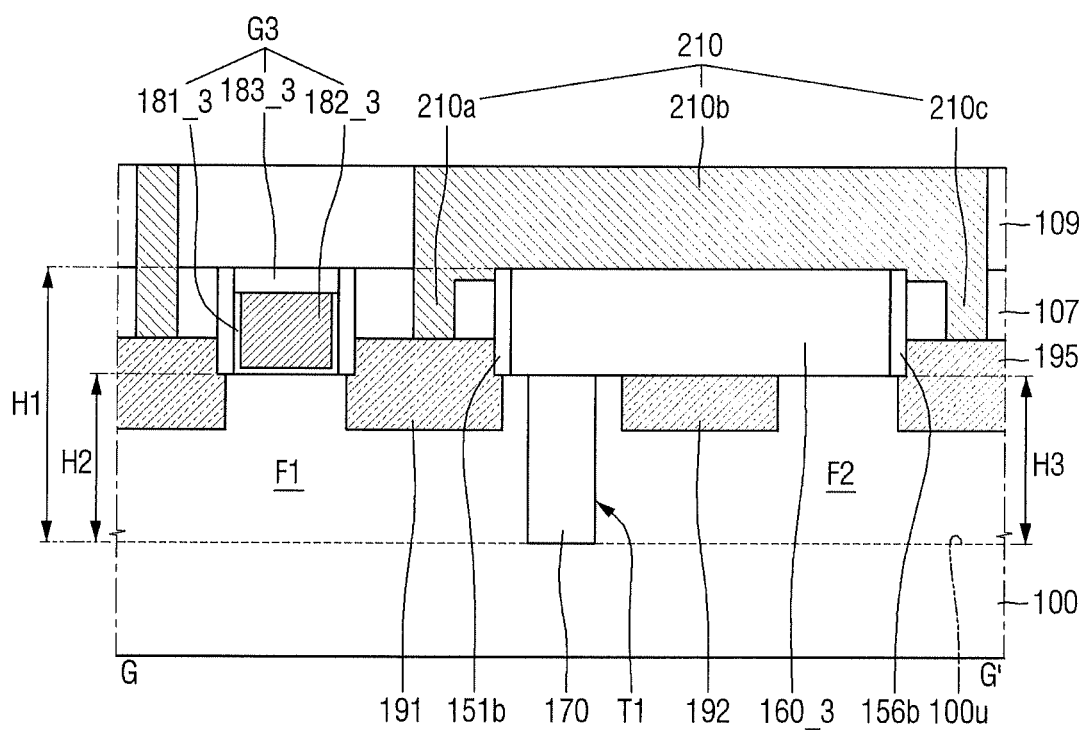
FIGS. 17 and 18 are respectively cross-sectional views taken along the line G-G' of FIG. 16.

FIG. 17 is a cross-sectional view taken along the line G-G' of FIG. 16. For ease of description, differences from the above description will be mainly described.

Referring to FIGS. 16 and 17, a third insulator 160_3 may be disposed not only between a first gate structure G1 and a second gate structure G2 but also between a fifth gate structure G5 and a sixth gate structure G6.

The fifth gate structure G5 may extend from a first side 161 of the third insulator 160_3 in a direction in which a third side 163 and a fourth side 164 of the third insulator 160_3 extend. The sixth gate structure G6 may extend from a second side 162 of the third insulator 160_3 in the direction in which the third side 163 and the fourth side 164 extend.

The first gate structure G1 and the fifth gate structure G5 may be spaced apart from each other in a direction in which the first side 161 of the third insulator 160_3 extends. The second gate structure G2 and the sixth gate structure G6 may be spaced apart from each other in a direction in which the second side 162 of the third insulator 160_3 extends. The fifth gate structure G5 may overlap a third fin pattern F3, and the sixth gate structure G6 may overlap a fourth fin pattern F4.

The fifth gate structure G5 may include a fifth gate insulating layer, a fifth gate electrode, and a fifth capping pattern. The sixth gate structure G6 may include a sixth gate insulating layer, a sixth gate electrode, and a sixth capping pattern. The fifth gate insulating layer may be substantially the same as a first gate insulating layer 181_1, and the sixth gate insulating layer may be substantially the same as a second gate insulating layer 181_2.

The third insulator 160_3 may connect not only the first gate structure G1 and the second gate structure G2 but also the fifth gate structure G5 and the sixth gate structure G6. The first side 161 of the third insulator 160_3 may directly contact the first gate structure G1 and the fifth gate structure G5. The second side 162 of the third insulator 160_3 may directly contact the second gate structure G2 and the sixth gate structure G6.

The third insulator 160_3 can simultaneously separate the first gate structure G1 and the second gate structure G2 and separate the fifth gate structure G5 and the sixth gate structure G6.

Like the first insulator 160_1 (see FIG. 1), the third insulator 160_3 may be disposed on a pattern 170. In addition, the third insulator 160_3 may cover the pattern 170.

A fifth gate spacer may include a first portion 155a and a second portion 155b spaced apart from each other by the third insulator 160_3 and arranged in the direction in which the third side 163 and the fourth side 164 extend. A sixth gate spacer may include a first portion 156a, a second portion 156b and a third portion 156c spaced apart from each other and arranged in the direction in which the third side 163 and the fourth side 164 extend. The third insulator 160_3 may be disposed between the first portion 154a and the second portion 154b of the fourth gate spacer and between the first portion 155a and the second portion 155b of the fifth gate spacer.

A second portion 151b of a first gate spacer and the second portion 156b of the sixth gate spacer may be formed on the third side 163 and the fourth side 164 of the third insulator 160_3, respectively.

The first source/drain region 191 may be disposed on a side of the third insulator 160_3, and the fifth source/drain region 195 may be disposed on the other side of the third insulator 160_3.

A third portion 210c of the first source/drain contact 210 may include a portion contacting the fifth source/drain region 195.

Like the first and second gate insulating layers 181_1 and 181_2, the fifth and sixth gate insulating layers may or may not be formed between the third insulator 160_3 and the first, second, fifth and sixth gate electrodes and between the third insulator 160_3 and the first, second, fifth and sixth capping patterns according to a process of manufacturing a semiconductor device according to some embodiments.

Figure 18:
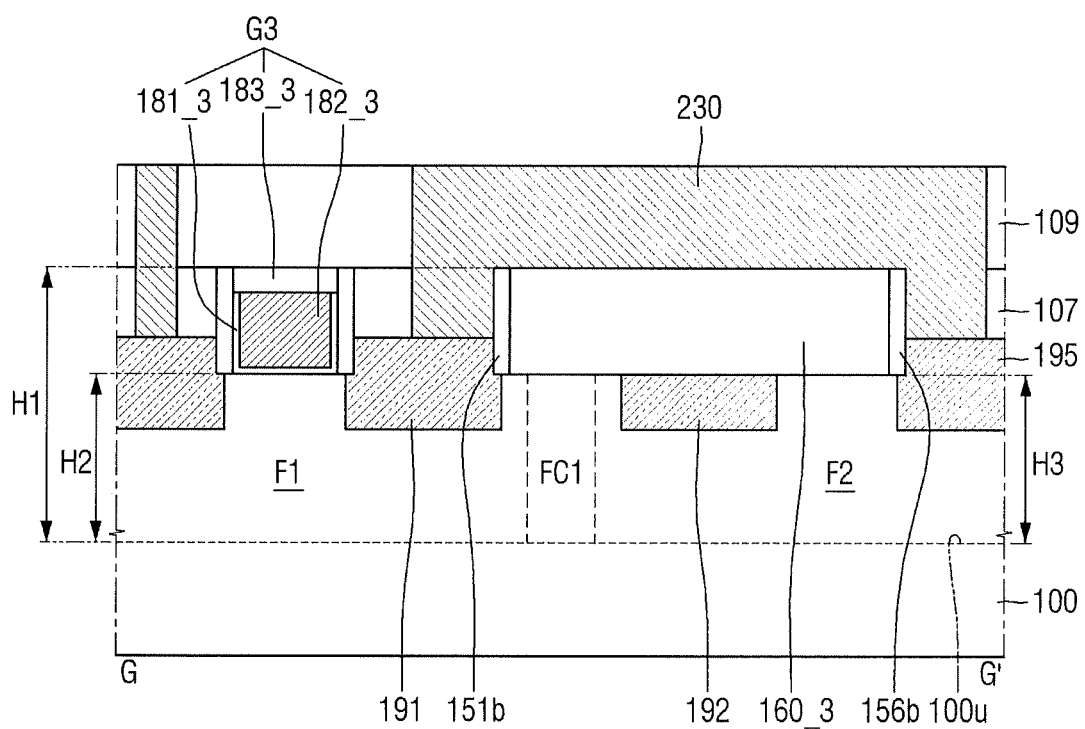

FIG. 18 is a cross-sectional view taken along the line G-G' of FIG. 16. For ease of description, differences from the above description will be mainly described.

Referring to FIGS. 16 and 18, a third insulator 160_3 may be disposed on a first connection fin pattern FC1. The third insulator 160_3 may cover the first connection fin pattern FC1.

Figure 19:
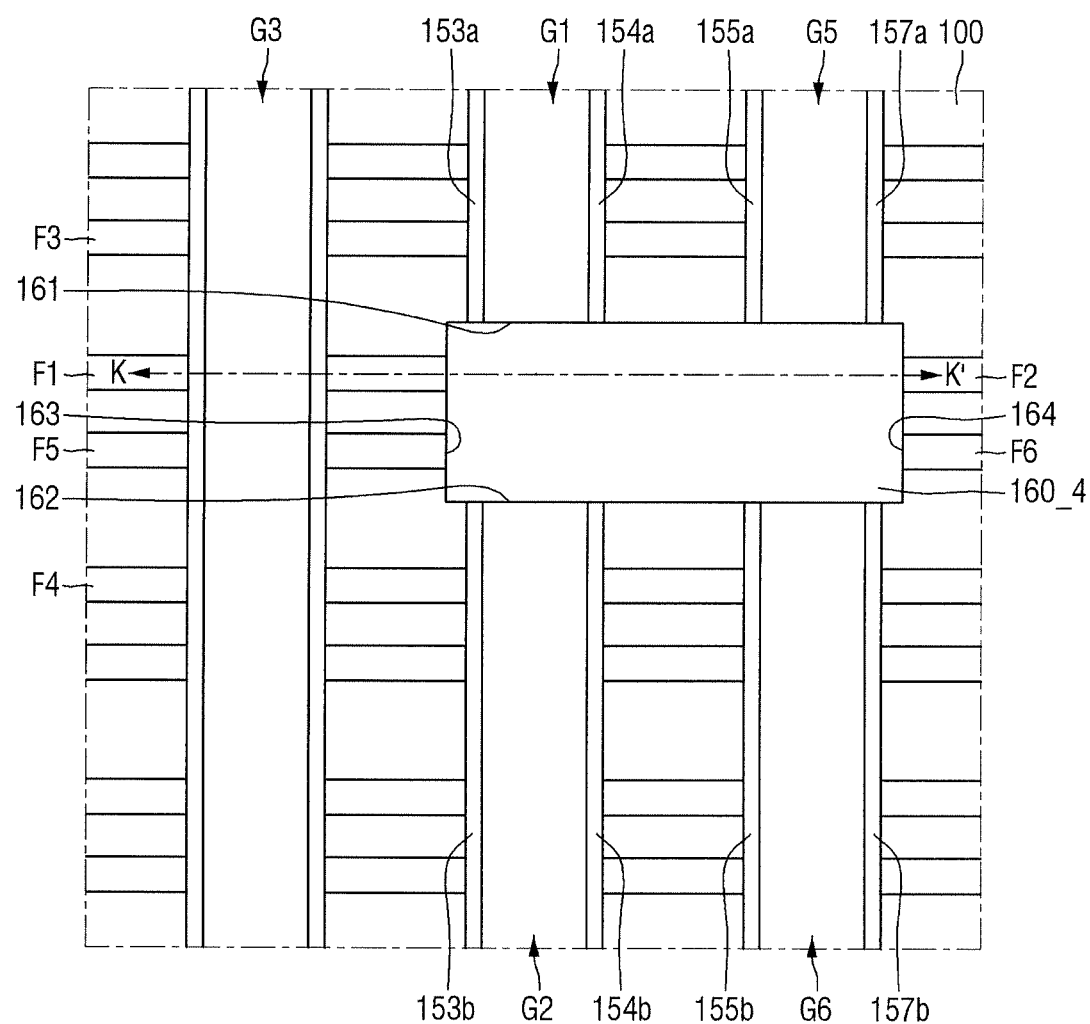
FIG. 19 is a layout view of a semiconductor device according to some embodiments.

FIG. 19 is a layout view of a semiconductor device according to some embodiments. For clarity of illustration, a field insulating layer 105, a first interlayer insulating film 107, a second interlayer insulating film 109, a first source/drain region 191, a fifth source/drain region 195, and a first source/drain contact 210 are not illustrated in FIG. 19.

Figure 20:
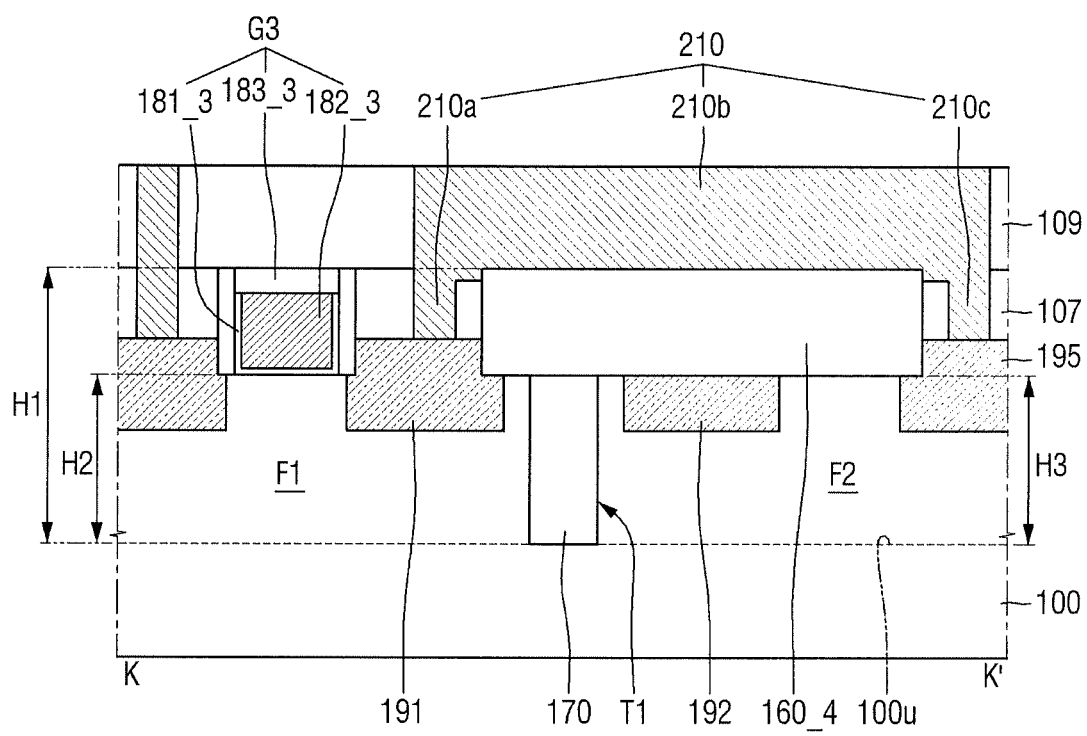
FIGS. 20 and 21 are respectively cross-sectional views taken along the line K-K' of FIG. 19.

FIG. 20 is a cross-sectional view taken along the line K-K' of FIG. 19. For ease of description, differences from the above description will be mainly described.

Referring to FIGS. 19 and 20, a third gate spacer 153a and 153b may not be formed on a third side 163 of a fourth insulator 160_4. In addition, a seventh gate spacer 157a and 157b may not be formed on a fourth side 164 of the fourth insulator 160_4. The fourth insulator 160_4 can simultaneously separate a first gate structure G1 and a second gate structure G2 and separate a fifth gate structure G5 and a sixth gate structure G6.

The fourth insulator 160_4 may be disposed on a pattern 170. In addition, the fourth insulator 160_4 may cover the pattern 170.

Figure 21:
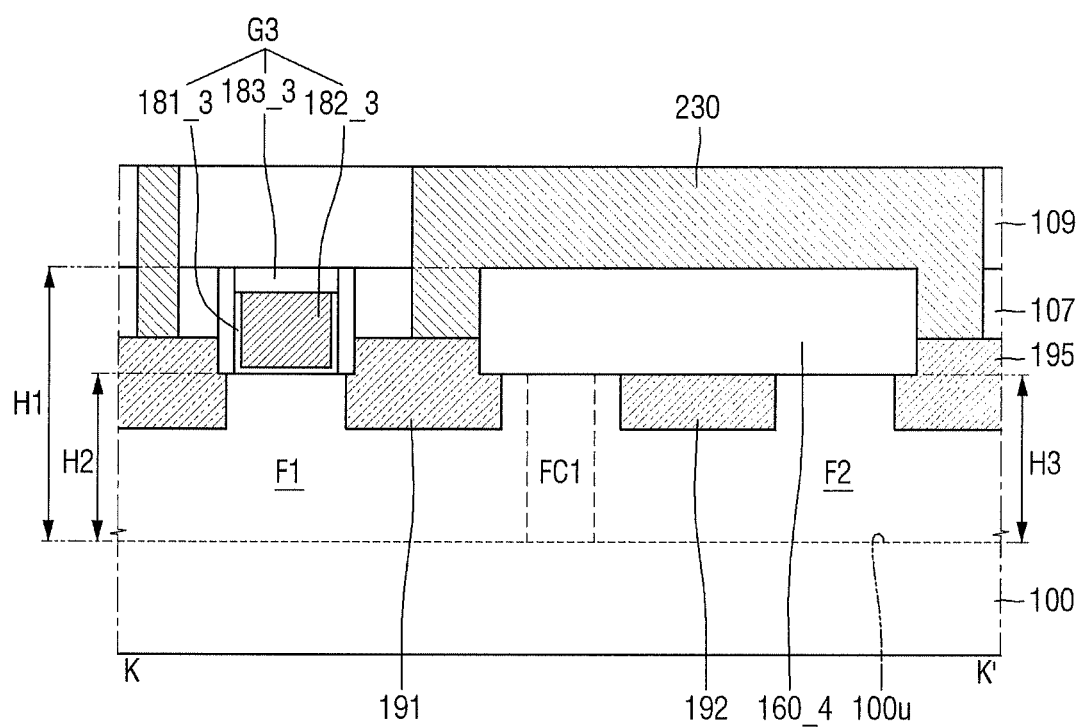

FIG. 21 is a cross-sectional view taken along the line K-K' of FIG. 20. For ease of description, differences from the above description will be mainly described.

Referring to FIGS. 20 and 21, a fourth insulator 160_4 may be disposed on a first connection fin pattern FC1. In addition, the fourth insulator 160_4 may cover the first connection fin pattern FC1.

Figure 22:
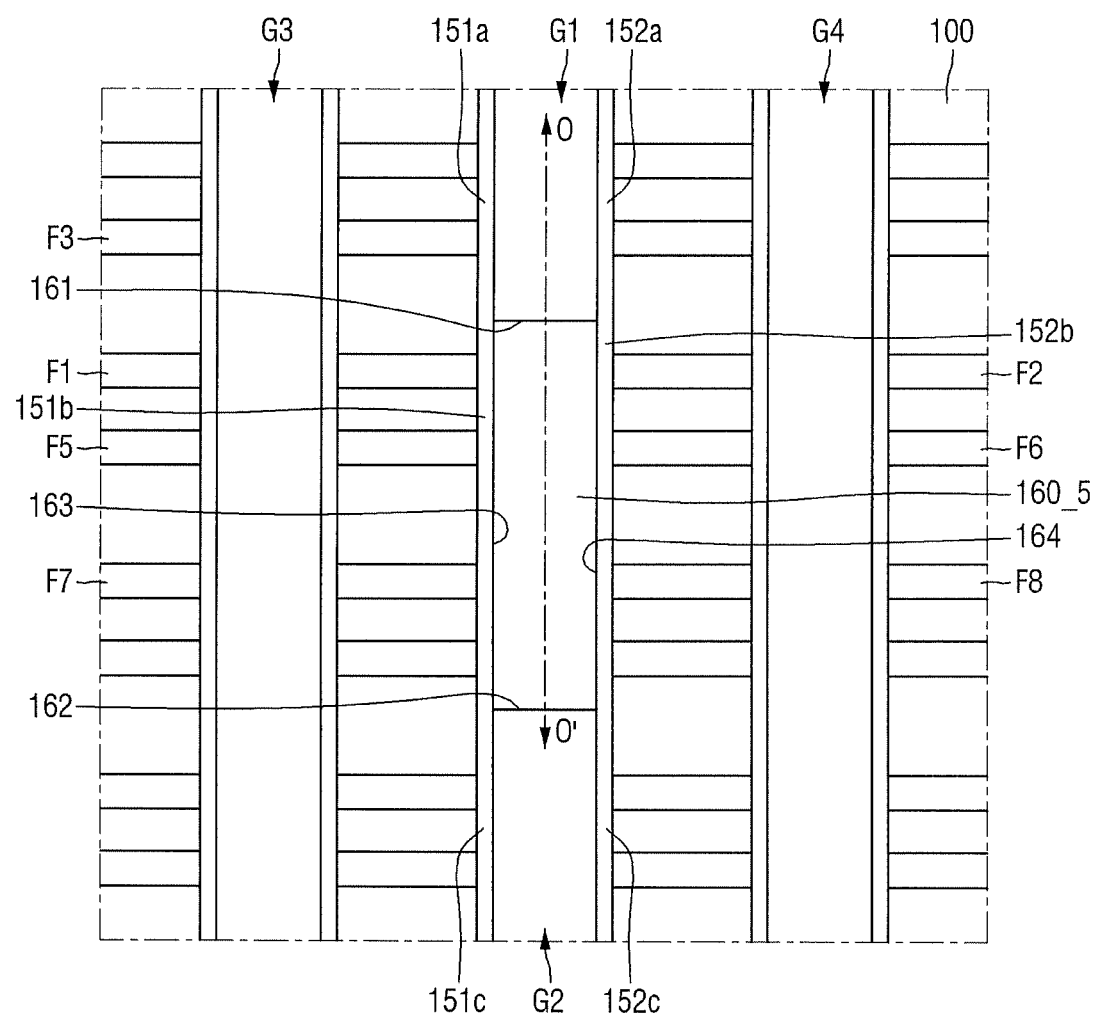
FIG. 22 is a layout view of a semiconductor device according to some embodiments.

FIG. 22 is a layout view of a semiconductor device according to some embodiments. For clarity of illustration, a field insulating layer 105, a first interlayer insulating film 107, a second interlayer insulating film 109, a first source/drain region 191, a fifth source/drain region 195, and a first source/drain contact 210 are not illustrated in FIG. 22.

Figure 23:
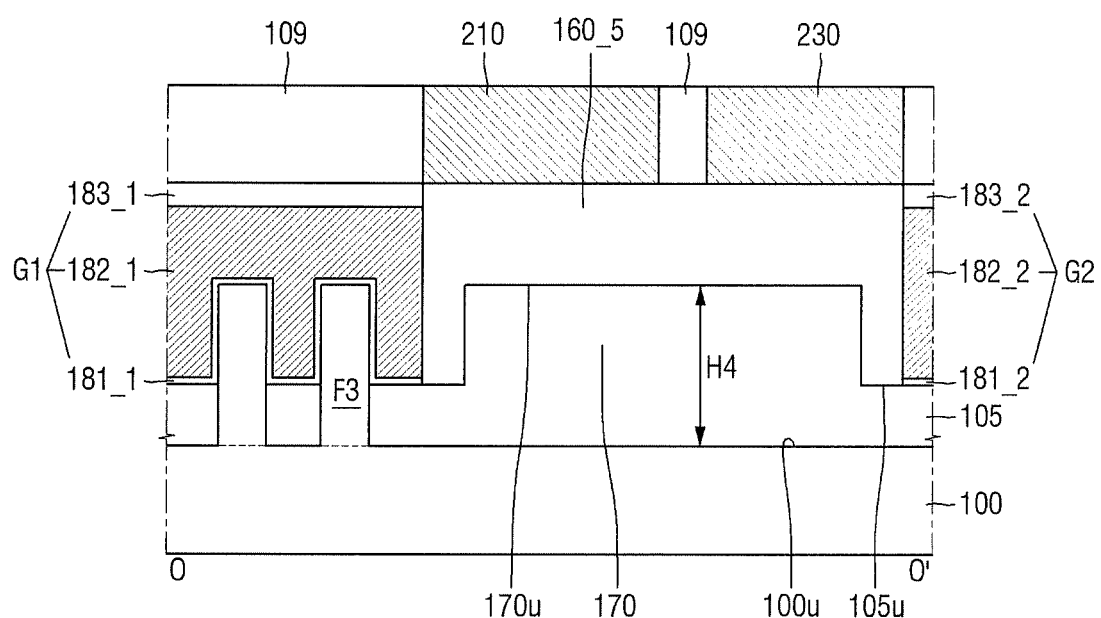
FIGS. 23 through 27 are respectively cross-sectional views taken along the line O-O' of FIG. 22.

FIG. 23 is a cross-sectional view taken along the line O-O' of FIG. 22. For ease of description, differences from the above description will be mainly described.

Referring to FIGS. 22 and 23, a fifth insulator 160_5 may be disposed not only between a first fin pattern F1 and a second fin pattern F2 but also between a seventh fin pattern F7 and an eighth fin pattern F8. Each of the seventh fin pattern F7 and the eighth fin pattern F8 may extend in a direction in which a first side 161 and a second side 162 of the fifth insulator 160_5 extend. The seventh fin pattern F7 and the eighth fin pattern F8 may be spaced from each other in the direction in which the first side 161 and the second side 162 of the fifth insulator 160_5 extend. The seventh fin pattern F7 may extend from a third side 163 in the direction in which the first side 161 and the second side 162 extend. The eighth fin pattern F8 may extend from a fourth side 164 in the direction in which the first side 161 and the second side 162 extend. The fifth insulator 160_5 may cover a pattern 170 protruding from an upper surface 105U of the field insulating layer 105.

In some embodiments, the pattern 170 may extend from between the first and second fin patterns F1 and F2 to between the seventh and eighth fin patterns F7 and F8. The pattern 170 may not only insulate the first fin pattern F1 and the second fin pattern F2 from each other but also insulate the seventh fin pattern F7 and the eighth fin pattern F8 from each other.

A third source/drain contact 230 may be disposed on the fifth insulator 160_5. The third source/drain contact 230 may directly connect a source/drain region which is located on a side of the fifth insulator 160_5 and disposed on the seventh fin pattern F7 and a source/drain region which is located on the other side of the fifth insulator 160_5 and disposed on the eighth fin pattern F8.

In a process of manufacturing a semiconductor device according to some embodiments, a portion of a gate structure extending continuously between a first gate spacer 151a, 151b, 151c and a second gate spacer 152a, 152b, 152c may be removed after the formation of a metal gate electrode. In this case, as described above, first and second gate insulating layers 181_1 and 181_2 may not be formed between the fifth insulator 160_5 and first and second gate electrodes 182_1 and 182_2 and between the fifth insulator 160_5 and first and second capping patterns 183_1 and 183_2.

Figure 24:
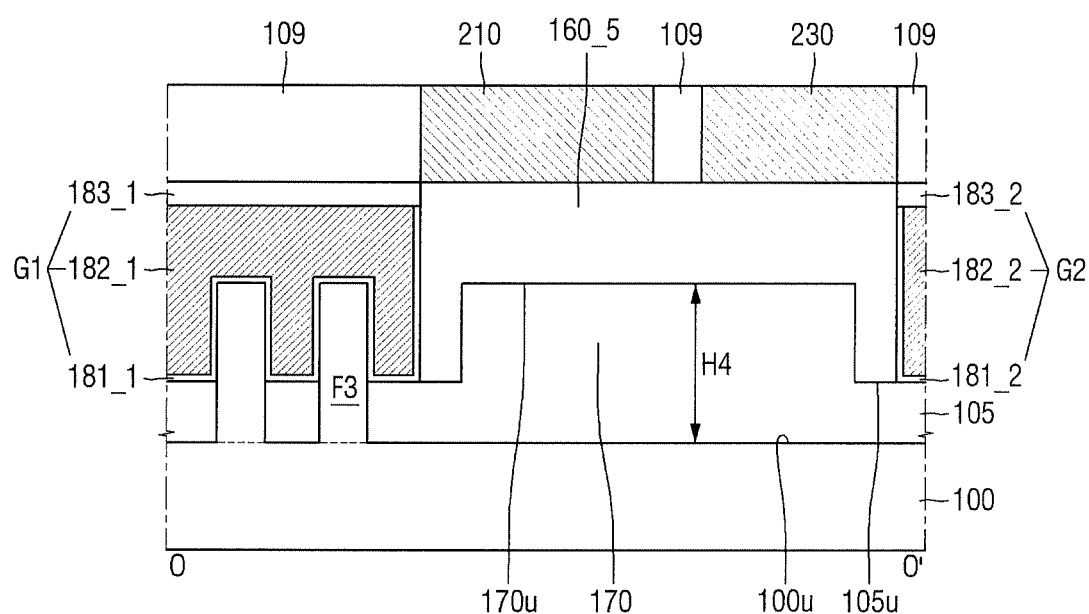

FIG. 24 is a cross-sectional view taken along the line O-O' of FIG. 22. For ease of description, differences from the above description will be mainly described.

Referring to FIGS. 22 and 24, if a portion of a gate structure extending continuously between a first gate spacer 151a, 151b, 151c and a second gate spacer 152a, 152b, 152c is removed before the formation of a metal gate electrode, first and second gate insulating layers 181_1 and 181_2 may be formed between a fifth insulator 160_5 and first and second gate electrodes 182_1 and 182_2 and between the fifth insulator 160_5 and first and second capping patterns 183_1 and 183_2.

Figure 25:
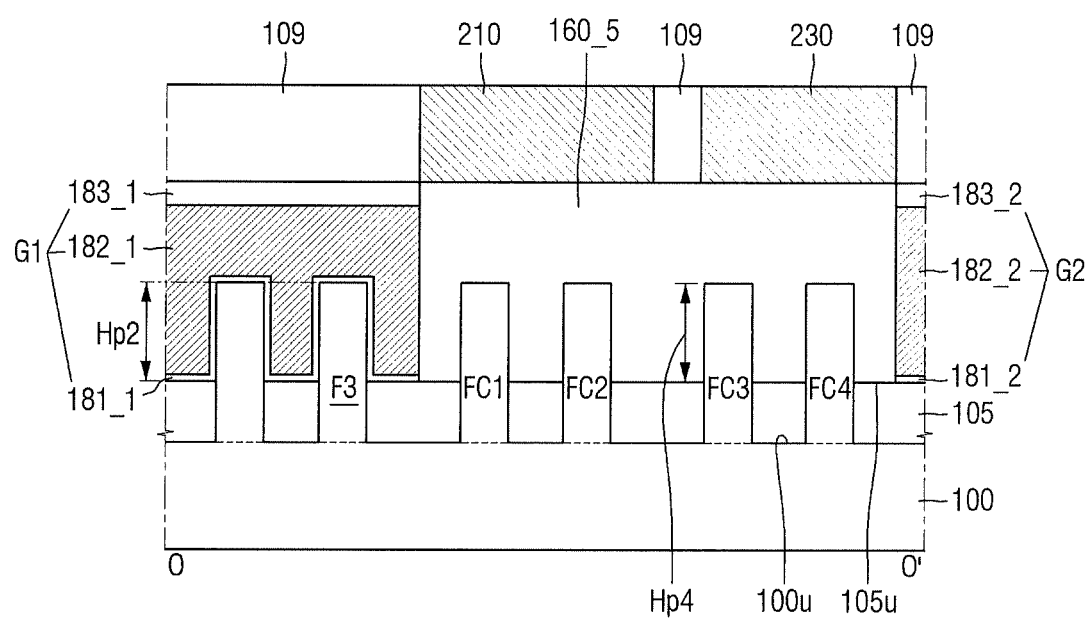
Figure 26:
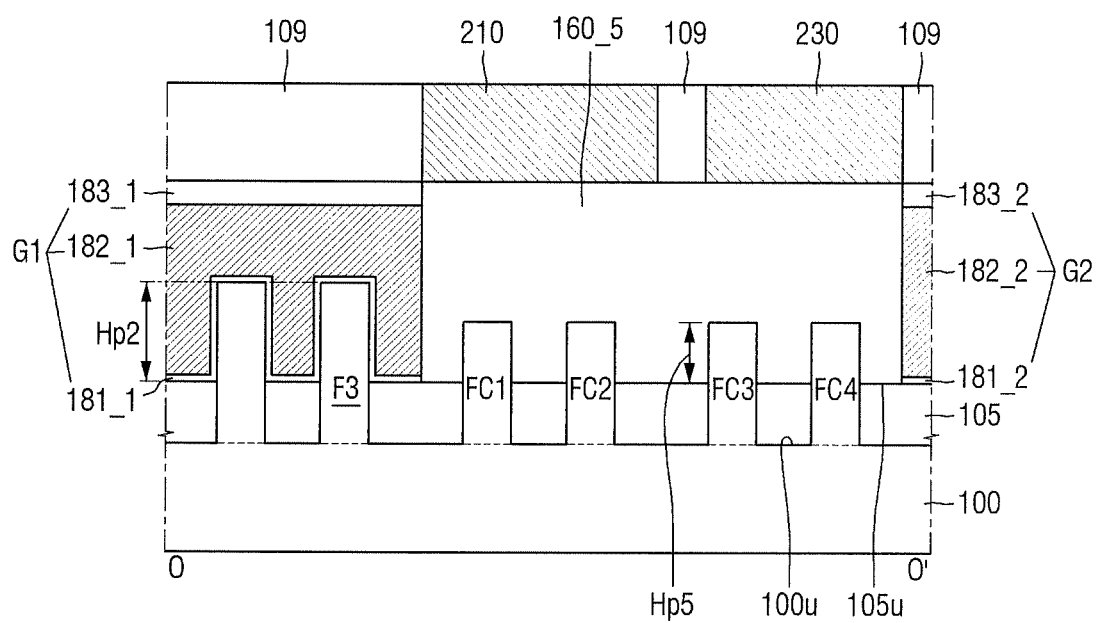

FIGS. 25 and 26 are respectively cross-sectional views taken along the line O-O' of FIG. 22. For ease of description, differences from the above description will be mainly described.

Referring to FIGS. 22, 25 and 26, a fifth insulator 160_5 may be disposed on a field insulating layer 105 to cover first through fourth connection fin patterns FC1 through FC4. Each of the third connection fin pattern FC3 and the fourth connection fin pattern FC4 may be substantially the same as the first connection fin pattern FC1. For example, since the third connection fin type pattern FC3 connects a seventh fin pattern F7 and an eighth fin pattern F8, the seventh fin pattern F7 and the eighth fin pattern F8 may be shaped like a single continuous fin extending along a direction in which a first side 161 and a second side 162 extend.

In a process of manufacturing a semiconductor device according to some embodiments, a portion of a gate structure extending continuously between a first gate spacer 151a, 151b, 151c and a second gate spacer 152a, 152b, 152c may be removed after the formation of a metal gate electrode. In this case, as described above, first and second gate insulating layers 181_1 and 181_2 may not be formed between the fifth insulator 160_5 and first and second gate electrodes 182_1 and 182_2 and between the fifth insulator 160_5 and first and second capping patterns 183_1 and 183_2.

In some embodiments, a height Hp4 of the third connection fin pattern FC3 may be substantially equal to a height Hp2 of a third fin pattern F3, as illustrated in FIG. 25. The height Hp4 of the third connection fin pattern FC3 may be a distance measured from an upper surface 100U of a substrate 100 to an upper surface of the third connection fin pattern FC3.

In some embodiments, a height Hp5 of the third connection fin pattern FC3 may be smaller than the height Hp2 of the third fin pattern F3, as illustrated in FIG. 26. For example, when a portion of the gate structure extending continuously between the first gate spacer 151a, 151b, 151c and the second gate spacer 152a, 152b, 152c is removed, at least a portion of the third connection fin pattern FC3 may also be removed. In this case, the height Hp5 of the third connection fin pattern FC3 may be smaller than the height Hp2 of the third fin pattern F3.

Figure 27:
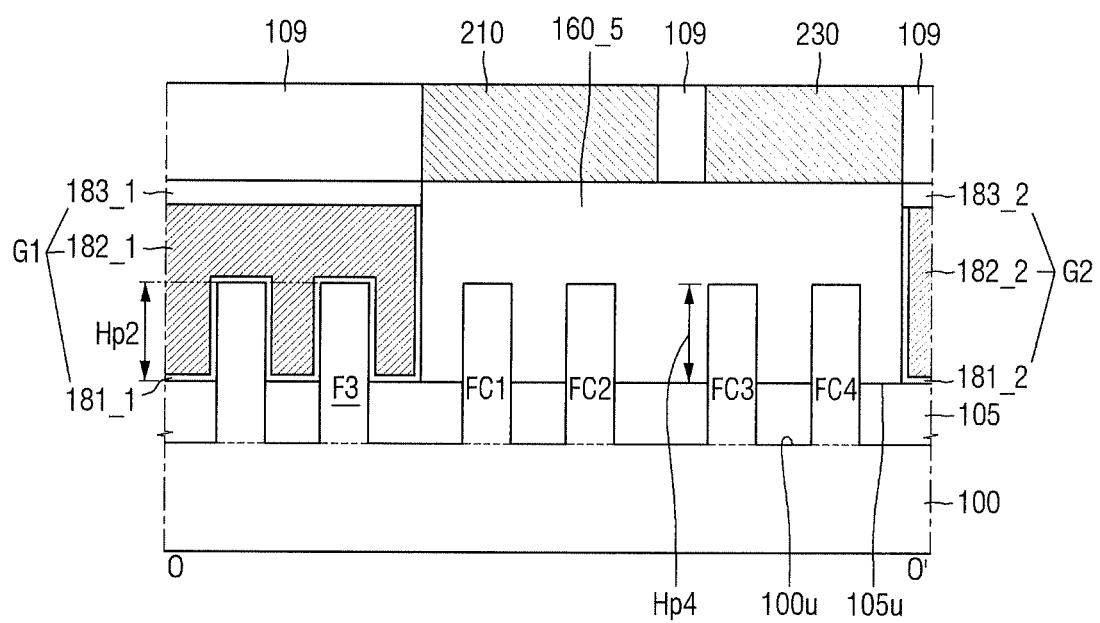

FIG. 27 is a cross-sectional view taken along the line O-O' of FIG. 22. For ease of description, differences from the above description will be mainly described.

Referring to FIGS. 22 and 27, in a process of manufacturing a semiconductor device according to some embodiments, a portion of a gate structure extending continuously between a first gate spacer 151a, 151b, 151c and a second gate spacer 152a, 152b, 152c may be removed before the formation of a metal gate electrode. In this case, as described above, first and second gate insulating layers 181_1 and 181_2 may be formed between a fifth insulator 160_5 and first and second gate electrodes 182_1 and 182_2 and between the fifth insulator 160_5 and first and second capping patterns 183_1 and 183_2.

While the present inventive concept has been particularly shown and described with reference to some exemplary embodiments thereof, it will be understood by those of ordinary skill in the art that various changes in form and details may be made therein without departing from the spirit and scope of the present inventive concept as defined by the following claims. It is therefore desired that the embodiments described herein be considered in all respects as illustrative and not restrictive, reference being made to the appended claims rather than the foregoing description to indicate the scope of the invention.

What is claimed is:

1. A semiconductor device comprising:
   an insulator on a substrate and having opposite first and second sides that each extend along a first direction and opposite third and fourth sides that each extend along a second direction different from the first direction, each of the third and fourth sides extending between the first and second sides;
   a first fin pattern extending from the third side of the insulator along the first direction;
   a second fin pattern extending from the fourth side of the insulator along the first direction;
   a first gate structure extending from the first side of the insulator along the second direction;
   a second gate structure extending from the second side of the insulator along the second direction, wherein the first gate structure and the second gate structure are separated from each other by the insulator interposed therebetween;
   a third fin pattern overlapped by the first gate structure, spaced apart from the first side of the insulator, and extending along the first direction; and
   a fourth fin pattern overlapped by the second gate structure, spaced apart from the second side of the insulator, and extending along the first direction,
   wherein an upper surface of the insulator is higher than an upper surface of the first fin pattern and an upper surface of the second fin pattern.

2. The semiconductor device of claim 1, further comprising an insulating pattern underlying the insulator and disposed between the first fin pattern and the second fin pattern.

3. The semiconductor device of claim 2, further comprising a field insulating layer disposed on the substrate and partially covering the first, second, third and fourth fin patterns,
   wherein the insulating pattern comprises a same material as the field insulating layer, and
   wherein an upper surface of the insulating pattern is higher than an upper surface of the field insulating layer.

4. The semiconductor device of claim 1, further comprising a connection fin pattern underlying the insulator and disposed between and connecting the first fin pattern and the second fin pattern.

5. The semiconductor device of claim 1, further comprising:
   a first source/drain region disposed adjacent at least one side of the insulator; and
   a source/drain contact disposed on the insulator and connected to the first source/drain region.

6. The semiconductor device of claim 5,
   wherein the source/drain contact comprises a first portion directly contacting the first source/drain region and a second portion overlying the insulator and connected to the first portion of the source/drain contact.

7. The semiconductor device of claim 6,
   wherein a portion of the insulator is inserted into the second portion of the source/drain contact.

8. The semiconductor device of claim 1, further comprising:
   a first source/drain region disposed on a side of the first gate structure; and
   a second source/drain region disposed on a second side of the first gate structure and connected to the first source/drain region.

9. A semiconductor device comprising:
   a field insulating layer disposed on a substrate;
   spaced apart first and second fin patterns protruding from an upper surface of the field insulating layer, wherein each of the first and second fin patterns includes a sidewall partially covered with the field insulating layer;
   an insulating pattern disposed between the first fin pattern and the second fin pattern and protruding from the upper surface of the field insulating layer;
   a first gate structure disposed on the first fin pattern;
   a second gate structure disposed on the second fin pattern; and
   an insulator disposed on the field insulating layer, covering the insulating pattern and contacting the first gate structure and the second gate structure, wherein the first gate structure and the second gate structure are separated from each other by the insulator interposed therebetween, and
   wherein uppermost surfaces of the first and second fin patterns are substantially coplanar with an upper surface of the insulating pattern.

10. The semiconductor device of claim 9,
    wherein the first gate structure extends from a first side of the insulator, and the second gate structure extends from a second side of the insulator opposite from the first side of the insulator.

11. The semiconductor device of claim 10, further comprising:
    a third gate structure extending from the first side of the insulator and spaced apart from the first gate structure; and a fourth gate structure extending from the second side of the insulator and spaced apart from the second gate structure.

12. The semiconductor device of claim 9, wherein the insulating pattern comprises a same material as the field insulating layer.

13. The semiconductor device of claim 12, further comprising a third fin pattern and a fourth fin pattern disposed between the first fin pattern and the second fin pattern and insulated from each other by the insulating pattern.

14. The semiconductor device of claim 13, wherein the field insulating layer has a trench therein which defines a short side of the third fin pattern and a short side of the fourth fin pattern which face each other, and wherein the insulating pattern fills the trench.

15. The semiconductor device of claim 13, further comprising:
   a first source/drain region disposed on at least one side of the insulator; and
   a source/drain contact disposed on the insulator and contacting the first source/drain region.

16. The semiconductor device of claim 9, wherein the insulating pattern comprises a different material from the field insulating layer.

17. A semiconductor device comprising:
   an insulator disposed on a substrate and comprising opposite first and second sides extending along a first direction and opposite third and fourth sides extending along a second direction different from the first direction, each of the third and fourth sides extending between the first and second sides;
   a first fin pattern extending from the third side of the insulator along the first direction;
   a second fin pattern extending from the fourth along the first direction;
   an insulating pattern underlying the insulator and between the first fin pattern and the second fin pattern;
   a first gate structure extending from the first side of the insulator along the second direction; and
   a second gate structure extending from the second side of the insulator along the second direction and insulated from the first gate structure by the insulator,
   wherein an upper surface of the insulator is higher than an upper surface of the first fin pattern and an upper surface of the second fin pattern.

18. The semiconductor device of claim 17, further comprising a field insulating layer disposed on the substrate and partially covering the first fin pattern and the second fin pattern,
   wherein the insulating pattern protrudes from an upper surface of the field insulating layer, and
   wherein the insulator contacts a top surface of the insulating pattern and a side surface thereof.

19. The semiconductor device of claim 18, wherein the insulating pattern comprises a same material as the field insulating layer.

20. The semiconductor device of claim 17, further comprising:
   a first source/drain region disposed on at least one side of the insulator; and
   a source/drain contact disposed on the insulator and connected to the first source/drain region.

* * * * *